US010658174B2

(12) United States Patent
Zhou et al.

(10) Patent No.: US 10,658,174 B2
(45) Date of Patent: May 19, 2020

(54) ATOMIC LAYER DEPOSITION AND ETCH FOR REDUCING ROUGHNESS

(71) Applicant: Lam Research Corporation, Fremont, CA (US)

(72) Inventors: Xiang Zhou, Santa Clara, CA (US); Naveed Ansari, Fremont, CA (US); Yoshie Kimura, Castro Valley, CA (US); Si-Yi Yi Li, Fremont, CA (US); Kazi Sultana, Fremont, CA (US); Radhika Mani, Fremont, CA (US); Duming Zhang, Union City, CA (US); Haseeb Kazi, Santa Clara, CA (US); Chen Xu, Pasadena, CA (US); Mitchell Brooks, Aptos, CA (US); Ganesh Upadhyaya, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/820,110

(22) Filed: Nov. 21, 2017

(65) Prior Publication Data
US 2019/0157066 A1 May 23, 2019

(51) Int. Cl.
*H01L 21/02* (2006.01)
*H01L 21/473* (2006.01)
(Continued)

(52) U.S. Cl.
CPC ...... *H01L 21/0228* (2013.01); *H01L 21/0217* (2013.01); *H01L 21/02164* (2013.01);
(Continued)

(58) Field of Classification Search
CPC ............ H01L 21/0228; H01L 21/7684; H01L 21/033; H01L 21/473; H01L 29/66; H01L 21/3085
(Continued)

(56) References Cited

U.S. PATENT DOCUMENTS

| 4,894,696 A | 1/1990 | Takeda |
| 5,514,246 A | 5/1996 | Blalock |

(Continued)

FOREIGN PATENT DOCUMENTS

| JP | 2013-021192 A | 1/2013 |
| JP | 2013-229351 A | 11/2013 |

(Continued)

OTHER PUBLICATIONS

U.S. Office Action, dated Nov. 19, 2015, issued in U.S. Appl. No. 14/560,414.
(Continued)

*Primary Examiner* — Bo Fan
(74) *Attorney, Agent, or Firm* — Weaver Austin Villeneuve & Sampson LLP

(57) ABSTRACT

Methods and apparatuses for reducing roughness using integrated atomic layer deposition (ALD) and etch processes are described herein. In some implementations, after a mask is provided on a substrate, methods include depositing a conformal layer on the mask by ALD to reduce roughness and etching a layer underlying the mask to form patterned features having a reduced roughness. In some implementations, after a substrate is etched to a first depth to form features at the first depth in the substrate, methods include depositing a conformal layer by ALD on sidewalls of the features to protect sidewalls and reduce roughness during a subsequent etch process. The ALD and etch processes may be performed in a plasma chamber.

12 Claims, 13 Drawing Sheets

(51) Int. Cl.
*H01L 21/033* (2006.01)
*H01L 21/768* (2006.01)
*H01L 21/308* (2006.01)
*H01L 29/78* (2006.01)

(52) U.S. Cl.
CPC ...... *H01L 21/02274* (2013.01); *H01L 21/033* (2013.01); *H01L 21/0337* (2013.01); *H01L 21/3085* (2013.01); *H01L 21/473* (2013.01); *H01L 21/7684* (2013.01); *H01L 29/785* (2013.01)

(58) Field of Classification Search
USPC ........................................................ 438/758
See application file for complete search history.

(56) References Cited

U.S. PATENT DOCUMENTS

| | | | |
|---|---|---|---|
| 5,767,018 A | 6/1998 | Bell | |
| 5,948,704 A | 9/1999 | Benjamin et al. | |
| 6,063,710 A | 5/2000 | Kadomura et al. | |
| 6,176,667 B1 | 1/2001 | Fairbairn et al. | |
| 6,547,977 B1 | 4/2003 | Yan et al. | |
| 6,841,943 B2 | 1/2005 | Vahedi et al. | |
| 6,916,746 B1 | 7/2005 | Hudson et al. | |
| 7,105,390 B2 | 9/2006 | Brask et al. | |
| 7,138,677 B2 | 11/2006 | Gutsche et al. | |
| 7,294,580 B2 | 11/2007 | Yun et al. | |
| 7,732,728 B2 | 6/2010 | Dhindsa et al. | |
| 7,740,736 B2 | 6/2010 | Fischer et al. | |
| 7,951,683 B1 | 5/2011 | Shanker | |
| 7,977,390 B2 | 7/2011 | Ji et al. | |
| 8,334,083 B2 | 12/2012 | Luong et al. | |
| 8,552,334 B2 | 10/2013 | Tappan et al. | |
| 9,171,716 B2 | 10/2015 | Fukuda | |
| 9,269,590 B2 | 2/2016 | Luere et al. | |
| 9,378,971 B1 | 6/2016 | Briggs et al. | |
| 9,384,998 B2 | 7/2016 | Hudson et al. | |
| 9,385,318 B1 | 7/2016 | Henri | |
| 9,543,148 B1 | 1/2017 | Hudson et al. | |
| 9,543,158 B2 | 1/2017 | Hudson et al. | |
| 9,548,188 B2 | 1/2017 | Hausmann | |
| 9,576,811 B2 | 2/2017 | Kanarik et al. | |
| 9,620,377 B2 | 4/2017 | Hudson et al. | |
| 9,805,941 B2 | 10/2017 | Kanarik et al. | |
| 9,806,252 B2 | 10/2017 | Tan et al. | |
| 9,870,899 B2 | 1/2018 | Yang et al. | |
| 9,887,097 B2 | 2/2018 | Hudson | |
| 9,997,371 B1* | 6/2018 | Agarwal | G03F 7/427 |
| 9,997,372 B2 | 6/2018 | Briggs et al. | |
| 9,997,373 B2 | 6/2018 | Hudson | |
| 9,997,631 B2 | 6/2018 | Yang et al. | |
| 10,074,543 B2 | 9/2018 | Mahorowala et al. | |
| 10,170,323 B2 | 1/2019 | Hudson et al. | |
| 10,170,324 B2 | 1/2019 | Dole et al. | |
| 10,297,459 B2 | 5/2019 | Hudson et al. | |
| 10,304,693 B2 | 5/2019 | Hudson | |
| 10,373,840 B2 | 8/2019 | Hudson et al. | |
| 10,431,458 B2 | 10/2019 | Hudson et al. | |
| 10,446,394 B2 | 10/2019 | Abatchev et al. | |
| 2002/0173160 A1 | 11/2002 | Keil et al. | |
| 2003/0003755 A1 | 1/2003 | Donohoe | |
| 2003/0139005 A1 | 7/2003 | Song et al. | |
| 2004/0077178 A1 | 4/2004 | Yang et al. | |
| 2004/0084410 A1 | 5/2004 | Lenz | |
| 2004/0224520 A1 | 11/2004 | Yun et al. | |
| 2005/0032388 A1 | 2/2005 | Donohoe | |
| 2005/0048785 A1 | 3/2005 | Kang et al. | |
| 2005/0136682 A1 | 6/2005 | Hudson et al. | |
| 2005/0218114 A1 | 10/2005 | Yue et al. | |
| 2006/0121721 A1 | 6/2006 | Lee et al. | |
| 2006/0226120 A1* | 10/2006 | Rusu | H01L 21/31116 216/67 |
| 2007/0026677 A1 | 2/2007 | Ji et al. | |
| 2007/0049018 A1 | 3/2007 | Sandhu et al. | |
| 2007/0196980 A1 | 8/2007 | Subramanian | |
| 2008/0230947 A1 | 9/2008 | Chou et al. | |
| 2008/0286978 A1 | 11/2008 | Chen et al. | |
| 2009/0163035 A1 | 6/2009 | Romano et al. | |
| 2009/0197420 A1 | 8/2009 | Luong et al. | |
| 2009/0203218 A1 | 8/2009 | Matsuyama et al. | |
| 2009/0206443 A1 | 8/2009 | Juengling | |
| 2009/0233446 A1 | 9/2009 | Sakao et al. | |
| 2009/0246965 A1 | 10/2009 | Mori et al. | |
| 2009/0275202 A1 | 11/2009 | Tanaka et al. | |
| 2009/0275205 A1 | 11/2009 | Kiehlbauch et al. | |
| 2010/0009543 A1 | 1/2010 | Cho | |
| 2010/0173494 A1 | 7/2010 | Kobrin | |
| 2010/0173496 A1 | 7/2010 | Zhong et al. | |
| 2010/0178770 A1 | 7/2010 | Zin | |
| 2010/0323525 A1 | 12/2010 | Chi et al. | |
| 2011/0089469 A1* | 4/2011 | Merckling | H01L 21/28264 257/201 |
| 2011/0201208 A1 | 8/2011 | Kawakami et al. | |
| 2012/0264305 A1 | 10/2012 | Nakano | |
| 2013/0189845 A1 | 7/2013 | Kim et al. | |
| 2013/0316518 A1 | 11/2013 | Hollister et al. | |
| 2013/0323923 A1 | 12/2013 | Koehler et al. | |
| 2014/0038412 A1 | 2/2014 | Hu et al. | |
| 2014/0043216 A1 | 2/2014 | Tang | |
| 2014/0065838 A1 | 3/2014 | Ellinger et al. | |
| 2014/0083978 A1* | 3/2014 | Mahadeswaraswamy | H01J 37/32522 216/67 |
| 2014/0144876 A1 | 5/2014 | Nakagawa et al. | |
| 2014/0213037 A1 | 7/2014 | LiCausi et al. | |
| 2014/0252478 A1 | 9/2014 | Doornbos et al. | |
| 2015/0083582 A1 | 3/2015 | Dhindsa et al. | |
| 2015/0102386 A1 | 4/2015 | Chen et al. | |
| 2015/0187602 A1 | 7/2015 | Kim et al. | |
| 2015/0249018 A1 | 9/2015 | Park et al. | |
| 2015/0322569 A1 | 11/2015 | Kilpi et al. | |
| 2015/0380272 A1 | 12/2015 | Wu et al. | |
| 2016/0056270 A1 | 2/2016 | Dal | |
| 2016/0064379 A1 | 3/2016 | Yu | |
| 2016/0111309 A1 | 4/2016 | Lill et al. | |
| 2016/0126243 A1 | 5/2016 | Weis | |
| 2016/0163556 A1 | 6/2016 | Briggs et al. | |
| 2016/0163557 A1 | 6/2016 | Hudson et al. | |
| 2016/0163558 A1 | 6/2016 | Hudson et al. | |
| 2016/0163561 A1 | 6/2016 | Hudson et al. | |
| 2016/0181117 A1 | 6/2016 | Arghavani et al. | |
| 2016/0218015 A1 | 7/2016 | Oomori et al. | |
| 2016/0260617 A1 | 9/2016 | Hudson et al. | |
| 2016/0260620 A1 | 9/2016 | Briggs et al. | |
| 2016/0268141 A1 | 9/2016 | Hudson | |
| 2016/0307769 A1 | 10/2016 | Tseng et al. | |
| 2016/0314985 A1 | 10/2016 | Yang et al. | |
| 2016/0336178 A1 | 11/2016 | Swaminathan et al. | |
| 2016/0343580 A1 | 11/2016 | Hudson | |
| 2016/0351407 A1 | 12/2016 | Sawataishi et al. | |
| 2016/0365425 A1 | 12/2016 | Chen et al. | |
| 2016/0379824 A1 | 12/2016 | Wise et al. | |
| 2016/0379856 A1 | 12/2016 | Tomura et al. | |
| 2017/0033119 A1 | 2/2017 | Park et al. | |
| 2017/0076945 A1 | 3/2017 | Hudson et al. | |
| 2017/0076955 A1 | 3/2017 | Hudson et al. | |
| 2017/0170026 A1 | 6/2017 | Hudson et al. | |
| 2017/0178920 A1 | 6/2017 | Dole et al. | |
| 2017/0229314 A1 | 8/2017 | Tan et al. | |
| 2017/0323831 A1 | 11/2017 | Jeong et al. | |
| 2018/0019387 A1 | 1/2018 | Tan et al. | |
| 2018/0033635 A1 | 2/2018 | Kanarik et al. | |
| 2018/0061650 A1 | 3/2018 | Mahorowala et al. | |
| 2018/0090491 A1 | 3/2018 | Huang et al. | |
| 2018/0174858 A1 | 6/2018 | Hudson | |
| 2018/0240667 A1 | 8/2018 | Yu et al. | |
| 2018/0286707 A1 | 10/2018 | Hudson et al. | |
| 2018/0308680 A1 | 10/2018 | Reddy et al. | |
| 2019/0043732 A1 | 2/2019 | Eason et al. | |
| 2019/0067120 A1 | 2/2019 | Ching et al. | |
| 2019/0109002 A1 | 4/2019 | Mattinen et al. | |
| 2019/0131135 A1 | 5/2019 | Belau et al. | |
| 2019/0148501 A1 | 5/2019 | Chen et al. | |

(56) References Cited

U.S. PATENT DOCUMENTS

| | | | |
|---|---|---|---|
| 2019/0157095 | A1 | 5/2019 | Zhou et al. |
| 2019/0157096 | A1 | 5/2019 | Zhou et al. |
| 2019/0206697 | A1 | 7/2019 | Eason et al. |
| 2019/0237330 | A1 | 8/2019 | Abatchev et al. |

FOREIGN PATENT DOCUMENTS

| | | |
|---|---|---|
| JP | 2011-086966 | 8/2014 |
| KR | 10-2006-0030717 | 4/2006 |
| KR | 10-2007-0047015 | 5/2007 |
| WO | WO 2017/048275 A1 | 3/2017 |

OTHER PUBLICATIONS

U.S. Notice of Allowance, dated Apr. 6, 2016, issued in U.S. Appl. No. 14/560,414.
U.S. Office Action, dated May 11, 2017, issued in U.S. Appl. No. 15/157,303.
U.S. Final Office Action, dated Sep. 28, 2017, issued in U.S. Appl. No. 15/157,303.
U.S. Office Action, dated Sep. 8, 2015, issued in U.S. Appl. No. 14/724,574.
U.S. Final Office Action, dated Dec. 18, 2015, issued in U.S. Appl. No. 14/724,574.
U.S. Notice of Allowance, dated Mar. 1, 2016, issued in U.S. Appl. No. 14/724,574.
U.S. Office Action, dated Jul. 11, 2016, issued in U.S. Appl. No. 14/697,521.
U.S. Notice of Allowance, dated Nov. 14, 2016, issued in U.S. Appl. No. 14/697,521.
U.S. Notice of Allowance (corrected Notice of Allowability), dated Dec. 5, 2016, issued in U.S. Appl. No. 14/697,521.
U.S. Office Action, dated Jul. 26, 2016, issued in U.S. Appl. No. 14/803,578.
U.S. Notice of Allowance, dated Dec. 5, 2016, issued in U.S. Appl. No. 14/803,578.
U.S. Office Action, dated Jun. 15, 2016, issued in U.S. Appl. No. 14/842,733.
U.S. Notice of Allowance, dated Nov. 9, 2016, issued in U.S. Appl. No. 14/842,733.
U.S. Notice of Allowance, dated Dec. 8, 2016, issued in U.S. Appl. No. 14/842,733.
U.S. Office Action, dated May 12, 2017, issued in U.S. Appl. No. 15/163,123.
U.S. Notice of Allowance, dated Sep. 26, 2017, issued in U.S. Appl. No. 15/163,123.
U.S. Office Action, dated Aug. 4, 2017, issued in U.S. Appl. No. 15/225,489.
PCT International Search Report and Written Opinion dated Nov. 9, 2017 issued in PCT/US2017/044986.
Engelhardt et al. (1988) "Deep Trench Etching Using $CBrF_3$ and $CBrF_3$/Chlorine Gas Mixtures," Siemens AG, Otto-Hahn-Ring, 8000 Munich 83, Germany, pp. 48-54.
Hanson et al. (2003) "Bonding Self-Assembled, Compact Organophosphonate Monolayers to the Native Oxide Surface of Silicon," J. Am. Chem. Soc.,125(51):16074-16080.
Jung et al. (2005) "Vapor-Phase Self-Assembled Monolayer for Improved Mold Release in Nanoimprint Lithography," Langmuir, 21(4):1158-1161.
Matsuo (May 1, 1980) "Selective etching of Si relative to $SiO_2$ without undercutting by $CBrF_3$ plasma," Applied Physics Letters, 36(9):768-770.
Ohiwa et al. (1990) "SiO2 Tapered Etching Employing Magnetron Discharge," 1990 Dry Process Symposium, ULSI Research Center, Toshiba Corp., V-3, pp. 105-109.
Ohiwa et al. (Feb. 1992) "SiO2 Tapered Etching Employing Magnetron Discharge of Fluorocarbon Gas," Jpn. J. Appl. Phys., 31(Part 1, 2A):405-410.
Yang et al. (2006) "CVD Growth Kinetics of $HfB_2$ Thin Films from the Single-Source Precursor $Hf(BH_4)_4$," Chem. Mater., American Chemical Society, 18(21):5088-5096.
Yanguas-Gil et al. (Sep./Oct. 2009) "Highly conformal film growth by chemical vapor deposition. II. Conformality enhancement through growth inhibition," Journal of Vacuum Science & Technology A, 27(5):1244-1248.
Zhou, Han and Bent, Stacey F. (Jul./Aug. 2013) "Fabrication of organic interfacial layers by molecular layer deposition: Present status and future opportunities," Journal of Vacuum Science Technology A, American Vacuum Society, 31(4), 040801-1-040801-18.
Zhuang et al. (2006) "Thermal stability of vapor phase deposited self-assembled monolayers for MEMS anti-stiction," J. Micromech. Microeng., 16:2259-2264.
U.S. Appl. No. 15/475,021, filed Mar. 30, 2017, Hudson et al.
U.S. Appl. No. 15/581,951, filed Apr. 28, 2017, Reddy et al.
U.S. Appl. No. 15/582,359, filed Apr. 28, 2017, Agarwal et al.
U.S. Appl. No. 15/667,551, filed Aug. 2, 2017, Eason et al.
U.S. Appl. No. 15/719,484, filed Sep. 28, 2017, Kanarik et al.
U.S. Appl. No. 15/719,497, filed Sep. 28, 2017, Tan et al.
U.S. Appl. No. 15/798,831, filed Oct. 31, 2017, Belau et al.
U.S. Appl. No. 15/820,108, filed Nov. 21, 2017, Zhou et al.
U.S. Appl. No. 15/820,263, filed Nov. 21, 2017, Zhou et al.
U.S. Notice of Allowance dated Feb. 13, 2018, issued in U.S. Appl. No. 15/157,303.
U.S. Office Action dated Jul. 27, 2018, issued in U.S. Appl. No. 15/157,322.
U.S. Office Action, dated Sep. 18, 2018, issued in U.S. Appl. No. 15/364,101.
U.S. Office Action dated Apr. 3, 2018 issued in U.S. Appl. No. 15/440,842.
U.S. Notice of Allowance dated Sep. 4, 2018 issued in U.S. Appl. No. 15/440,842.
U.S. Office Action, dated Oct. 17, 2018, issued in U.S. Appl. No. 15/846,018.
U.S. Final Office Action, dated Dec. 21, 2017, issued in U.S. Appl. No. 15/225,489.
U.S. Notice of Allowance, dated Feb. 9, 2018, issued in U.S. Appl. No. 15/225,489.
U.S. Office Action, dated May 15, 2018, issued in U.S. Appl. No. 15/449,799.
U.S. Notice of Allowance, dated Sep. 26, 2018, issued in U.S. Appl. No. 15/449,799.
U.S. Office Action, dated Feb. 5, 2018, issued in U.S. Appl. No. 15/475,021.
U.S. Final Office Action, dated Aug. 7, 2018, issued in U.S. Appl. No. 15/475,021.
International Search Report and Written Opinion dated Jun. 29, 2018 issued in PCT/US2018/022239.
U.S. Appl. No. 15/881,506, filed Jan. 26, 2018, Abatchev.
U.S. Office Action dated Jun. 7, 2018, issued in U.S. Appl. No. 15/667,551.
U.S. Final Office Action dated Feb. 7, 2019, issued in U.S. Appl. No. 15/157,322.
U.S. Notice of Allowance dated Jan. 23, 2019, issued in U.S. Appl. No. 15/364,101.
U.S. Office Action, dated Apr. 1, 2019, issued in U.S. Appl. No. 15/359,362.
U.S. Notice of Allowance dated Mar. 7, 2019, issued in U.S. Appl. No. 15/846,018.
U.S. Notice of Allowance dated Dec. 14, 2018, issued in U.S. Appl. No. 15/667,551.
U.S. Notice of Allowance dated Mar. 26, 2019, issued in U.S. Appl. No. 15/903,865.
International Preliminary Report on Patentability dated Feb. 14, 2019 issued in PCT/US2017/044986.
International Search Report and Written Opinion dated Nov. 9, 2018 issued in PCT/US2018/043967.
International Search Report and Written Opinion dated Mar. 5, 2019 issued in PCT/US2018/060743.
International Search Report and Written Opinion dated Mar. 6, 2019 in Application No. PCT/US2018/060732.

(56) References Cited

OTHER PUBLICATIONS

International Search Report and Written Opinion dated Mar. 6, 2019 in Application No. PCT/US2018/060739.
U.S. Appl. No. 16/296,057, filed Mar. 7, 2019, Eason et al.
U.S. Final Office Action dated Feb. 8, 2019 issued in U.S. Appl. No. 15/798,831.
U.S. Office Action dated Dec. 11, 2018 issued in U.S. Appl. No. 15/820,263.
U.S. Office Action dated Dec. 14, 2018 issued in U.S. Appl. No. 15/881,506.
U.S. Notice of Allowance dated Apr. 4, 2019 issued in U.S. Appl. No. 15/820,263.
U.S. Notice of Allowance dated Mar. 8, 2019 issued in U.S. Appl. No. 15/881,506.
U.S. Notice of Allowance dated Apr. 15, 2019, issued in U.S. Appl. No. 15/157,322.
U.S. Notice of Allowance, dated Jun. 13, 2019, issued in U.S. Appl. No. 15/359,362.
Taiwanese First Office dated Apr. 17, 2019 issued in TW 104139822.
Taiwanese Decision of Refusal dated Aug. 19, 2019 issued in TW 104139822.
Taiwanese First Office Action dated May 13, 2019 issued in TW 104139815.
International Preliminary Report on Patentability dated Oct. 10, 2019 issued in PCT/US2018/022239.
U.S. Office Action dated Jul. 15, 2019 issued in U.S. Appl. No. 15/820,108.
U.S. Notice of Allowance dated Sep. 16, 2019 issued in U.S. Appl. No. 15/820,263.
U.S. Notice of Allowance dated Jul. 3, 2019 issued in U.S. Appl. No. 15/881,506.
International Search Report and Written Opinion dated May 14, 2019 in Application No. PCT/US2019/014580.
U.S. Final Office Action dated Jan. 3, 2020 issued in U.S. Appl. No. 15/798,831.
U.S. Office Advisory Action dated Mar. 3, 2020 issued in U.S. Appl. No. 15/798,831,
International Preliminary Report on Patentability dated Feb. 13, 2020 issued in PC/US2018/043967.
U.S. Final Office Action dated Jan. 6, 2020 issued in U.S. Appl. No. 15/820,108.
U.S. Notice of Allowance dated Mar. 25, 2020 issued in U.S. Appl. No. 15/820,108.

* cited by examiner

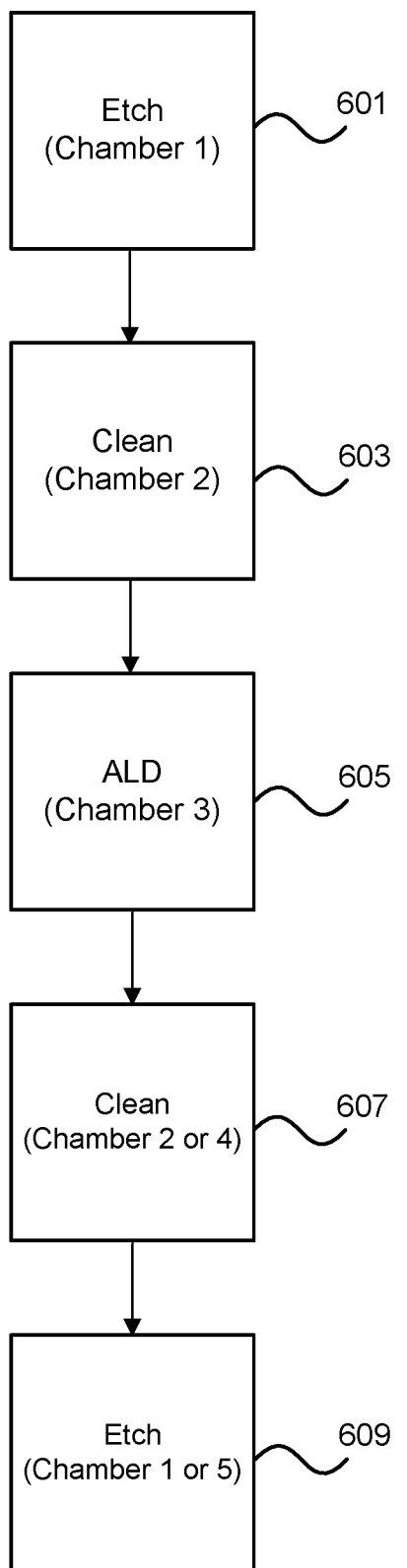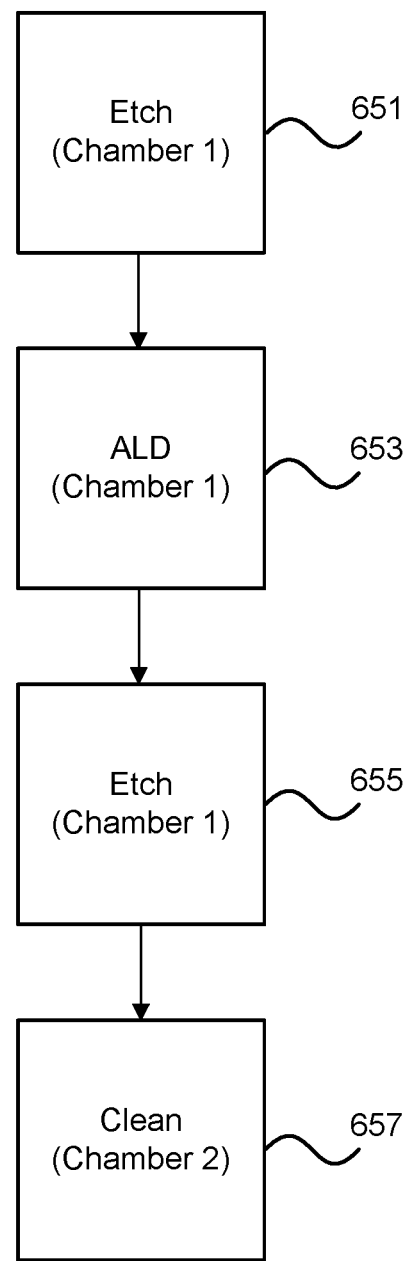
FIG. 6A
FIG. 6B

ATOMIC LAYER DEPOSITION AND ETCH FOR REDUCING ROUGHNESS

TECHNICAL FIELD

This disclosure relates generally to integrated deposition and etch processes in fabrication of semiconductor devices and, more particularly, to integrated atomic layer deposition (ALD) and etch processes in critical dimension control in fabrication of integrated circuits.

BACKGROUND

As device and features size continue to shrink in the semiconductor industry, patterning features of small critical dimensions will continue to gain importance in fabrication of advanced integrated circuits (ICs). Current patterning methods may result in an uneven surface and roughness that can have an adverse impact on transistor or device performance, and current treatment techniques for reducing roughness may have an undesirable effect on the critical dimensions of patterned features.

SUMMARY

This disclosure pertains to a method for reducing roughness from patterning. The method includes depositing, in a plasma chamber, a first conformal layer on a patterned mask layer of a substrate by atomic layer deposition (ALD), where the substrate includes a first material layer and the patterned mask layer overlying the first material layer, the patterned mask layer having a first roughness prior to depositing the first conformal layer. The method further includes etching, in the plasma chamber, the first material layer to form a plurality of first patterned features of the first material layer defined by the patterned mask layer, where the plurality of first patterned features has a second roughness less than the first roughness of the patterned mask layer after etching the first material layer.

In some implementations, the first roughness corresponds to a first line edge roughness (LER) and a first line width roughness (LWR) and the second roughness corresponds to a second LER and a second LWR, wherein the second LER is equal to or less than about 2.0 nm and wherein the second LWR is equal to or less than about 2.0 nm. In some implementations, a thickness of the first conformal layer is between about 0.5 nm and about 5 nm. In some implementations, the patterned mask layer is configured to define one or more one-dimensional (1-D) features from the first material layer and one or more two-dimensional (2-D) features from the first material layer, where a critical dimension (CD) bias between the one or more 1-D features and the one or more 2-D features is substantially similar after etching the first material layer. In some implementations, the patterned mask layer includes one or more isolated features in an isolated feature region and one or more dense features in a dense feature region having a greater feature density than the isolated feature region, where a CD bias between the one or more isolated features and the one or more dense features is substantially similar after etching the first material layer. In some implementations, the method further includes a second material layer underlying the first material layer. The method further includes depositing, in the plasma chamber, a second conformal layer by ALD on exposed surfaces of the plurality of first patterned features, the patterned mask layer, and the second material layer, and etching, in the plasma chamber, the second material layer of the substrate to form a plurality of second patterned features defined by the plurality of first patterned features. In some implementations, the plurality of second patterned features has a third roughness less than each of the first roughness and the second roughness. In some implementations, a critical dimension of the plurality of first patterned features is equal to or less than about 20 nm. In some implementations, depositing the first conformal layer by ALD includes introducing a precursor into the plasma chamber to adsorb on the patterned mask layer, converting the precursor with plasma to form an adsorption-limited amount of the first conformal layer, and repeating operations of introducing the precursor and converting the precursor until a desired thickness of the first conformal layer is deposited on the patterned mask layer.

This disclosure also pertains to a method of reducing sidewall roughness. The method includes etching, in a plasma chamber, to a first depth of a substrate to form a plurality of features at the first depth. The method further includes depositing, in the plasma chamber, a first passivation layer on sidewalls of the plurality of features by atomic layer deposition (ALD). The method further includes etching, in the plasma chamber, the plurality of features to a second depth greater than the first depth, where the first passivation layer is configured to substantially reduce sidewall roughness after etching to the second depth.

In some implementations, one or both of an LWR and LER value of the sidewalls is equal to or less than about 1.5 nm after etching the plurality of features to the second depth. In some implementations, the plurality of features include shallow trench isolation (STI) features. In some implementations, a depth-to-width aspect ratio of each of the plurality of features is equal to or greater than 10:1. In some implementations, each of the first depth and the second depth is greater than about 100 nm. In some implementations, the plurality of features include one or more isolated features in an isolated feature region and one or more dense features in a dense feature region having a greater feature density than the isolated feature region, where a thickness of the first passivation layer along sidewalls of the plurality of features is substantially similar in the isolated feature region and the dense feature region. In some implementations, the plurality of features are defined by a plurality of structures, wherein one or more first structures includes a first material and one or more second structures includes a second material different than the first material, where a thickness of the first passivation layer along sidewalls of the plurality of features is substantially similar for the one or more first structures and the one or more second structures. In some implementations, the method further includes depositing, in the plasma chamber, a second passivation layer on the sidewalls of the plurality of features by ALD, and etching, in the plasma chamber, the plurality of features to a third depth greater than the second depth in the substrate, where the second passivation layer is configured to substantially reduce sidewall roughness after etching through the substrate to the third depth. In some implementations, the first passivation layer includes silicon oxide ($SiO_x$).

These and other aspects are described further below with reference to the drawings.

BRIEF DESCRIPTION OF THE DRAWINGS

FIG. 6A shows an example process flow for substrate transport using etch and ex-situ ALD processes.

FIG. 6B shows an example process flow for substrate transport using integrated etch and ALD processes.

DETAILED DESCRIPTION

Introduction

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Integrated Etch/ALD Processing Apparatus

As feature sizes shrink, pitch becomes smaller, and complementary metal-oxide-semiconductor (CMOS) technology scales to smaller nodes, thin conformal deposition techniques will continue to gain importance. Atomic layer deposition (ALD) is a film forming technique which is well-suited to the deposition of thin conformal films due to the fact that ALD deposits a single thin layer of material, the thickness being limited by the amount of one or more precursor reactants which may adsorb onto a substrate surface (i.e., forming an adsorption-limited layer) prior to the film-forming chemical reaction itself. Each layer formed by ALD is thin and conformal, with the resulting film substantially conforming to the shape of underlying device structures and features.

Conventionally, ALD and etch processes are performed on separate tools or platforms. For example, ALD chambers do not run etch processes, and etch chambers do not run ALD processes. Plasma etch chambers that run a deposition process use a plasma-induced deposition process to form films that are not conformal and that are aspect ratio dependent.

Figure 1:
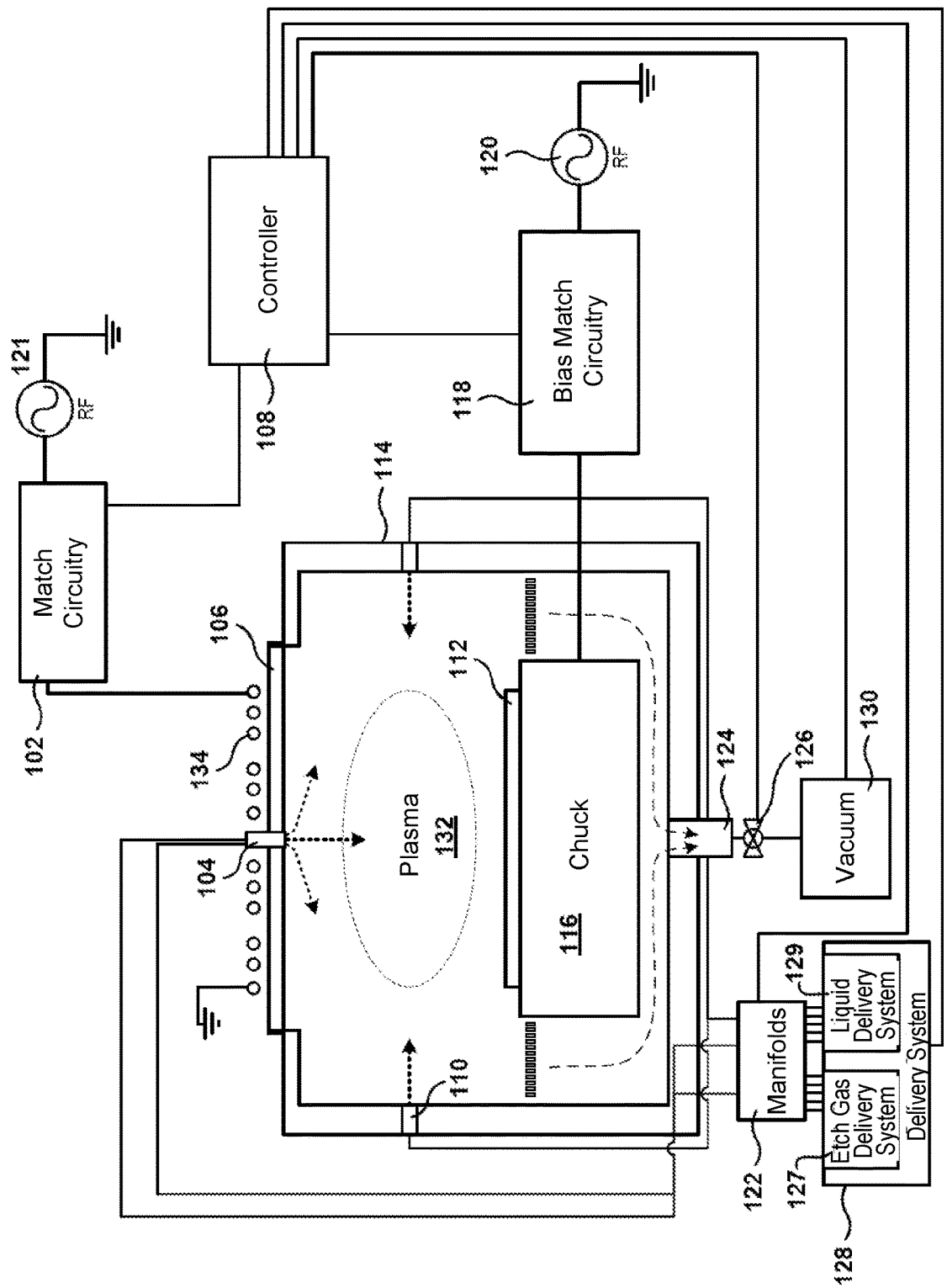
FIG. 1 is a schematic diagram of an example processing apparatus for performing etch and ALD operations according to some implementations.

FIG. 1 is a schematic diagram of an example processing apparatus for performing etch and ALD operations according to some implementations. The processing apparatus 100 may be an inductively coupled plasma processing apparatus. The processing apparatus 100 includes a plasma chamber 132 such as a plasma etch chamber. In some implementations, a Kiyo™ reactor, produced by Lam Research Corporation of Fremont, Calif., is an example of a suitable reactor that may be used as the plasma etch chamber.

Details regarding the processing apparatus 100 for performing etch and ALD operations are described in U.S. patent application Ser. No. 15/669,871, filed Aug. 4, 2017 to Zhou et al., and entitled "INTEGRATED ATOMIC LAYER PASSIVATION IN TCP ETCH CHAMBER AND IN-SITU ETCH-ALP METHOD," which is incorporated by reference in its entirety and for all purposes.

The plasma chamber 132 may include an overall chamber structure that may be defined by chamber walls 114 and a window 106. The window 106 may be fabricated from quartz or other dielectric material. In some implementations, the plasma chamber 132 includes a substrate support 116 disposed inside the plasma chamber 132. In some implementations, the substrate support 116 is an electrostatic chuck for supporting a substrate 112 upon which a deposition/etch process is performed. The electrostatic chuck may include electrostatic electrodes for chucking and dechucking the substrate 112. A filter and DC clamp power supply (not shown) may be provided for this purpose. Other control systems for lifting the substrate 112 off the substrate support 116 may also be provided. The substrate support 116 is configured to receive and hold the substrate 112.

In some implementations, the substrate support 116 may include a heater (not shown) to heat the substrate 112. The substrate support 116 may operate at elevated temperatures, such as between about 20° C. and about 150° C. The temperature will depend on the process operation and specific recipe. In some implementations, the plasma chamber 132 may also operate at certain pressures, such as pressures in between about 1 mTorr and about 1 Torr.

In some implementations, the processing apparatus 100 may include a radio-frequency (RF) power supply 120 that may be used for biasing/charging the substrate support 116. The RF power supply 120 may be defined by one or more RF generators. If multiple RF generators are provided, different frequencies may be used to achieve various tuning characteristics. A bias matching circuitry 118 is coupled between the RF power supply 120 and the substrate support 116. In this manner, the RF power supply 120 is connected to the substrate support 116.

A coil 134 is positioned over the window 106. The coil 134 may be fabricated from an electrically conductive material and includes at least one complete turn. The coil 134 shown in FIG. 1 includes at least three turns. An RF power supply 121 is configured to supply RF power to the coil 134. A matching circuitry 102 is coupled between the RF power supply 121 and the coil 134. In this manner, the RF power supply 121 is connected to the coil 134. In some implementations, an optional Faraday shield (not shown) is positioned between the coil 134 and the window 106. The Faraday shield may be maintained in a spaced apart relationship relative to the coil 134. The Faraday shield may be disposed immediately above the window 106. The Faraday shield may prevent metal or other species from depositing on the window 106 of the plasma chamber 132.

RF power is supplied from the RF power supply 121 to the coil 134 to cause an RF current to flow through the coil 134. The RF current flowing through the coil 134 may generate an electromagnetic field about the coil 134. The electromagnetic field generates an inductive current within the plasma chamber 132 that acts on the gas(es) present in the plasma chamber 132 to produce a plasma. Various ions and/or radicals from the plasma may interact with the substrate 112 to perform a deposition or etch operation.

In some implementations, the processing apparatus 100 optionally includes a plasma grid (not shown) that may be used to divide the plasma chamber 132 into an upper portion and a lower portion. The plasma grid may be used to limit the amount of hot electrodes into the lower portion of the plasma chamber 132. In some implementations, the processing apparatus 100 is designed to operate such that plasma present in the lower portion of the plasma chamber 132 is an ion-ion plasma and the plasma present in the upper portion of the plasma chamber 132 is an electron-ion plasma.

Process gases may be introduced into the plasma chamber 132 through a first gas injector 104 from the top of the plasma chamber 132 and/or through a second gas injector 110 from the side of the plasma chamber 132. Process gases may include vaporized liquid precursors or vaporized solid precursors, which may be vaporized in a solid source evaporator (not shown) upstream of the processing apparatus 100. One or more reactant gases may be supplied through the first gas injector 104 and/or second gas injector 110. In some implementations, the gas injectors 104, 110 may be replaced by showerheads. It will be understood that additional or other gas supplies may be provided for supplying different gases to the plasma chamber 132 for various types of operations.

The various ways of injecting gas(es) into the plasma chamber 132 show that process gases, vaporized liquid precursors, and/or vaporized solid precursors may be provided into the plasma chamber 132 from various locations. In some implementations, only the first gas injector 104 is used. In some other implementations, only the second gas injector 110 is used. In some other implementations, both the first gas injector 104 and the second gas injector 110 are used. In some implementations, manifolds 122 control which gases are supplied to each of the different gas lines. Manifolds 122 allow for any type of gas (reactant, carrier, precursor, etc.) to be provided from any of the different gas lines. In some implementations, carrier gases can include gases such as oxygen ($O_2$), nitrogen ($N_2$), and helium (He). The gases may be introduced into the plasma chamber 132 without mixing or may be mixed with other gases before introduction into the plasma chamber 132.

Manifolds 122 may be used for selecting, switching, and/or mixing outputs from respective delivery systems in a delivery system 128. The delivery system 128 may, in some implementations, include an etch gas delivery system 127 and a liquid delivery system 129. The etch gas delivery system 127 may be configured to output etchant gases. Examples of etchant gases include but are not limited to chlorine ($Cl_2$), hydrogen bromide (HBr), and sulfur hexafluoride ($SF_6$). The liquid delivery system 129 may be configured to provide liquid precursor that is vaporized and delivered in vapor form in an ALD process. The vaporized liquid precursor may be introduced into the plasma chamber 132 and may adsorb onto a surface of the substrate 112. The adsorbed precursor may be converted to form an adsorption-limited amount of film using a plasma. An example liquid precursor may have a chemical composition of the formula: $C_xH_yN_zO_aSi_b$.

A vacuum pump 130 is connected to the plasma chamber 132 and may be used to draw out process gases from the plasma chamber 132 and to maintain a certain pressure within the plasma chamber 132. A valve 126 may be disposed between an exhaust 124 and the vacuum pump 130 to control the amount of vacuum suction being applied to the plasma chamber 132. In some implementations, the vacuum pump 130 can be a one or two stage mechanical dry pump and/or turbomolecular pump. In some implementations, the vacuum pump 130 may be activated after each time an ALD process is completed to purge the plasma chamber 132.

The processing apparatus 100 may be coupled to facilities (not shown) when installed in a clean room or a fabrication facility. Facilities include plumbing that provide processing gases, vacuum, temperature control, and environmental particle control. These facilities may be coupled to the processing apparatus 100 when installed in the target fabrication facility. Additionally, the processing apparatus 100 may be coupled to a transfer chamber that allows robotics to transfer substrates into and out of the plasma chamber 132 using automation.

In some implementations, a system controller 108 (which may include one or more physical or logical controllers) controls some or all of the operations of the processing apparatus 100. The system controller 108 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the system controller 108 they may be provided over a network. In certain implementations, the system controller 108 executes system control software.

The system control software may include instructions for controlling the timing of application and/or magnitude of any one or more of the following chamber operational conditions: the mixture and/or composition of gases, chamber pressure, chamber temperature, wafer/wafer support temperature, the bias applied to the substrate (which in various implementations may be zero), the frequency and power applied to coils or other plasma generation components, substrate position, substrate movement speed, and other parameters of a particular process performed by the tool. System control software may be configured in any suitable way. For example, various process tool component subroutines or control objects may be written to control operations of the process tool components necessary to carry out various process tool processes. System control software may be coded in any suitable compute readable programming language.

In some embodiments, system control software includes input/output control (IOC) sequencing instructions for controlling the various parameters described above. For example, each phase of a semiconductor fabrication process may include one or more instructions for execution by the system controller 108. The instructions for setting process conditions for a phase may be included in a corresponding recipe phase, for example. In some implementations, the recipe phases may be sequentially arranged, such that steps in a doping process are executed in a certain order for that process phase. For example, a recipe may be configured to perform etch operations and include one or more cycles of an ALD process performed in between each of the etch operations.

In some implementations, the system controller 108 is configured with instructions for performing one or more of the following operations: etching, in the plasma chamber 132, a first layer of a substrate 112 to form a mask pattern of features, the mask pattern of features having a width that is less than a desired width of a plurality of structures to be formed by the mask pattern of features; depositing, in the plasma chamber 132, a first passivation layer on the mask pattern of features by ALD, the first passivation layer being deposited with a thickness that increases the width of the mask pattern of features to the desired width; and etching, in the plasma chamber 132, a second layer of the substrate 112 to form the plurality of structures having the desired width. The etching and depositing operations are performed without introducing a vacuum break in the plasma chamber 132. In some implementations, the system controller 108 is further configured to perform the following operation: repeating operations of depositing by ALD and etching in the plasma chamber 132.

Other computer software and/or programs may be employed in some embodiments. Examples of programs or sections of programs for this purpose include substrate positioning program, a process gas composition control program, a pressure control program, a heater control program, and an RF power supply control program.

In some cases, the system controller 108 controls gas concentration, substrate movement, and/or the power supplied to the coil 134 and/or substrate support 116. The system controller 108 may control the gas concentration by, for example, opening and closing relevant valves to produce one or more inlet gas stream that provide the necessary reactant(s) at the proper concentration(s). The substrate movement may be controlled by, for example, directing a substrate positioning system to move as desired. The power supplied to the coil 134 and/or substrate support 116 may be controlled to provide particular RF power levels. If a grid is used, the RF powers may be adjusted by the system controller 108 to create an electron-ion plasma in an upper portion of the plasma chamber 132 and ion-ion plasma in a lower portion of the plasma chamber 132. Further, the system controller 108 may be configured to supply power to the substrate support 116 under conditions such that an electron-ion plasma does not form in the lower portion of the plasma chamber 132.

The system controller 108 may control these and other aspects based on sensor output (e.g., when power, potential, pressure, etc. reach a certain threshold), the timing of an operation (e.g., opening valves at certain times in a process), or based on received instructions from the user.

In some implementations, a system controller 108 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 108, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the system controller 108 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 108 in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The system controller 108, in some implementations, may be a part of or coupled to a computer that is integrated with, coupled to the system, otherwise networked to the system, or a combination thereof. For example, the system controller 108 may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 108 receives instructions in the form of data, which specify parameters for each of the processing steps to be performed during one or more operations. It should be understood that the parameters may be specific to the type of process to be performed and the type of tool that the system controller 108 is configured to interface with or control. Thus as described above, the system controller 108 may be distributed, such as by comprising one or more discrete controllers that are networked together and working towards a common purpose, such as the processes and controls described herein. An example of a distributed system controller 108 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the system controller 108 might communicate with one or more of other tool circuits or modules, other tool components, cluster tools, other tool interfaces, adjacent tools, neighboring tools, tools located throughout a factory, a main computer, another system controller 108, or tools used in material transport that bring containers of substrates to and from tool locations and/or load ports in a semiconductor manufacturing factory.

Line Width Roughness and Line Edge Roughness

Patterning methods are used in many semiconductor manufacturing processes to achieved desired features. A mask, such as a photoresist pattern, serves to pattern underlying layers to form the desired features, including 1-D features (e.g., lines, trenches, etc.) and 2-D features (e.g., holes, squares, etc.). However the edges of a mask are usually not straight, leading to deviations from linearity. The deviations from linearity may result in non-linearities to form in patterned features that may adversely impact device performance. Such deviations may be characterized as line width roughness (LWR) and/or line edge roughness (LER).

With critical dimensions (CDs) becoming smaller in semiconductor device fabrication, lithography processes for achieving small CDs and controlling LER and LWR are more and more challenging. The effect of LER/LWR becomes amplified with smaller CDs. LWR refers to a deviation in a width of a line measured over a given length. LWR is generally quantified as the 3σ deviation of the width. LER refers to a deviation of an edge of a line, which may be understood as a deviation of an edge from a straight line as viewed top-down. LWR and LER values may be calculated according to a given inspection length or area using known methods. Uncontrolled LWR and/or LER may have significant impact on a resulting semiconductor device, and conventional lithography techniques are typically insufficient to address these concerns.

By way of an illustration, a conventional photolithography technique defines features of a semiconductor device using patterning and etching processes. In these processes, a photoresist material is deposited on a substrate and then is exposed to light filtered by a reticle. The reticle is generally a glass plate that is patterned with feature geometries that block light from propagating through the reticle. After passing through the reticle, the light contacts the surface of the surface of the photoresist material and changes the chemical composition of the photoresist material such that a developer can remove a portion of the photoresist material. A developer is applied to the photoresist material to remove the portion of the photoresist material. In the case of positive photoresist materials, the exposed regions are removed, and in the case of negative photoresist materials, the unexposed regions are removed. The patterned photoresist material is used as a mask to etch underlying layers.

Due to the limits of the chemical properties of the photoresists, the wavelengths or light sources, and/or the resolution limits in optical systems, the patterned photoresist material may include some amount of LWR and/or LER. Without being limited by any theory, this may be attributable to photoresist molecules that form in a random pattern and lack uniformity throughout the patterned photoresist material after exposure and development. The LWR and/or LER in the patterned photoresist material may be transferred to underlying layers in a subsequent etching process and reduces the resolution of the photolithography process.

LWR and/or LER may affect the performance of various semiconductor devices. For example, with planar or three-dimensional CMOS devices and interconnect structures, higher LWR/LER values may result in reduced resolution, non-uniform CD, slower speed, yield loss, increased resistivity, and reduced performance, among other things. With regards to process integration, higher LWR/LER values may cause features to merge where CD spacing is small, which may result in short-circuiting and ultimately device failure.

For fin field effect transistor (FinFET) formation, larger LWR/LER worsens device performance as surface roughness serve as scattering centers for charge carriers and may reduce transistor speed and increase power consumption. For patterning processes, large LWR/LER may result in line breaking or line bridging and cause local pattern infidelity. When the patterning is used for subsequent interconnect metal fill, such breaking/bridging defect will result in open/short circuits which renders the semiconductor device inoperable.

Improvements to LWR and/or LER are typically achieved using one of several strategies, such as: development of new resists with smaller intrinsic roughness, optimization of the lithography process including dose optimization and resist optimization, and application of post-development smoothing processes. Dose optimization may involve exposing a resist material at higher exposure doses to decrease randomness of resist development, but this often has a tradeoff with throughput and cost. Resist optimization may involve changing the resist process parameters, such as a concentration of a developer and development time, or changing the chemical formula of the resist, but this often results in a process that is slow, is expensive, and involves long cycle time.

Figure 2:
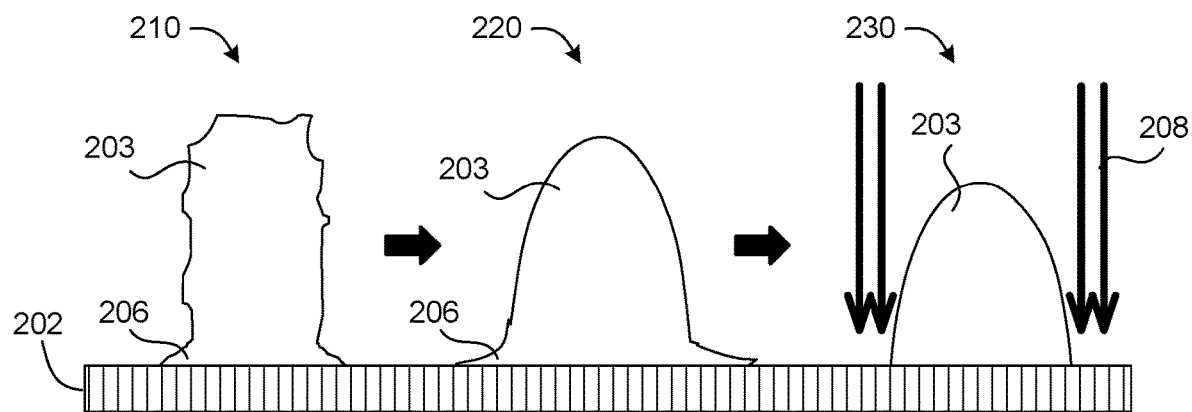
FIG. 2 is a schematic illustration of a mask undergoing a conventional plasma pretreatment to reduce roughness in the mask.
Figure 3:
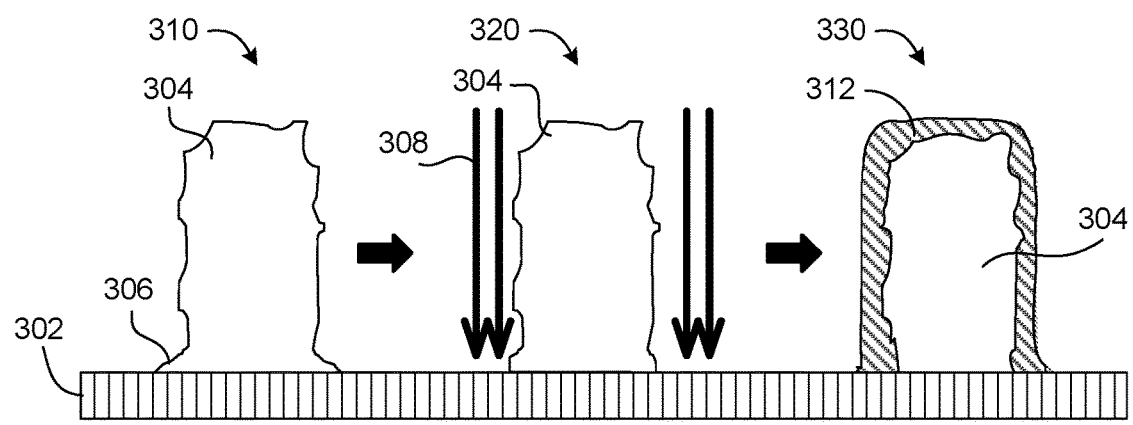
FIG. 3 is a schematic illustration of a mask undergoing a conventional plasma deposition and plasma etch sequence to reduce roughness in the mask.

Conventional post-development smoothing processes may include a plasma treatment for smoothing resist patterns as shown in FIG. 2 or a plasma deposition/etch treatment for smoothing resist patterns as shown in FIG. 3. While the aforementioned post-development smoothing processes may reduce LWR and/or LER, possible concerns of such post-development smoothing processes entail a limited tuning window due to selectivity issues, limited tuning window due to CD or CD loading requirements, reduced selectivity, reduced mask height, and iso-dense CD loading.

FIG. 2 is a schematic illustration of a mask undergoing a conventional plasma treatment to reduce roughness in the mask. At step 210 prior to plasma treatment, a mask 204 may be a patterned photoresist mask on a substrate 202 with a profile exhibiting roughness, including LWR and LER. In some implementations, the mask 204 includes one or more feet 206 protruding laterally from the mask 204. At step 220 following a plasma treatment, the mask 204 may have its profile rounded to smooth out its roughness. The plasma treatment may or may not cause the one or more feet 206 to become larger. The plasma treatment may use mild plasma conditions so that a plasma is not sufficiently aggressive to etch the mask 204. Without being limited by any theory, the plasma "cures" the mask 204 to reflow molecules of the mask 204 to reduce roughness, thereby resulting in a rounded profile. The non-etching plasma may be non-directional. Examples of non-etching plasma for reducing roughness in the mask 204 include hydrogen ($H_2$) plasma, argon (Ar) plasma, or combinations thereof. At step 230 following an anisotropic etch, the one or more feet 206 may be removed from the mask 204. The anisotropic etch may use directional ions 208 to etch or "chop" off the one or more feet 206. Otherwise, the presence of the one or more feet 206 may add to the LWR of the mask 204.

The plasma treatment shown in FIG. 2 may reduce LWR and/or LER of a mask, but the plasma treatment may reduce mask height, change resist shape, and reduce etch selectivity. This may degrade the performance of the mask in its resistance to an etching operation. In addition, the plasma treatment may have a limited tuning window due to selectivity issues. The resist is typically softened and height is reduced significantly from the plasma treatment. The softer and shorter resist may not last through the subsequent etch steps when the pattern is transferred down. This will lead to pattern infidelity or increases to LWR/LER due to mask erosion.

FIG. 3 is a schematic illustration of a mask undergoing a conventional plasma deposition and plasma etch sequence to reduce roughness in the mask. At step 310 prior to an anisotropic etch and prior to plasma deposition, a mask 304 may be a patterned photoresist mask on a substrate 302 with a profile exhibiting roughness, including LWR and LER. In some implementations, the mask 304 includes one or more feet 306 protruding laterally from the mask 304. At step 320 following an anisotropic etch, the one or more feet 306 may be removed from the mask 304. The anisotropic etch may use directional ions 308 to etch or "chop" off the one or more feet 306 that may otherwise contribute to the LWR of the mask 304. At step 330 following plasma deposition, a passivation layer 312 may be deposited on sidewalls and a top surface of the mask 304. The passivation layer 312 smooths out the sidewalls and surfaces of the mask 304 to reduce roughness. The passivation layer 312 may be deposited using a chemical vapor deposition (CVD) or plasma-enhanced chemical vapor deposition (PECVD) process. However, such deposition processes typically deposit layers that are not conformal. CVD or PECVD processes are dependent on aspect ratio and deposit more material in more open spaces or wider pitches than in less open spaces or narrower pitches. Furthermore, the amount of CD bias in 1-D features (e.g., lines) may be different than in 2-D features (e.g., holes) when using CVD or PECVD processes. Following the plasma deposition, a plasma etch operation (not shown) is performed to trim the deposited passivation layer 312. The plasma etch operation to trim the passivation layer 312 may control the CD of the mask 304.

The plasma deposition and plasma etch sequence shown in FIG. 3 may be performed in the same chamber or tool. The plasma deposition and plasma etch sequence in FIG. 3 may reduce roughness but result in CD loading, with more material being deposited in isolated features than in dense features, and with more material being deposited on 2-D features than on 1-D features. CD loading between isolated and dense features is shown in FIGS. 4A-4C.

Figure 4A:
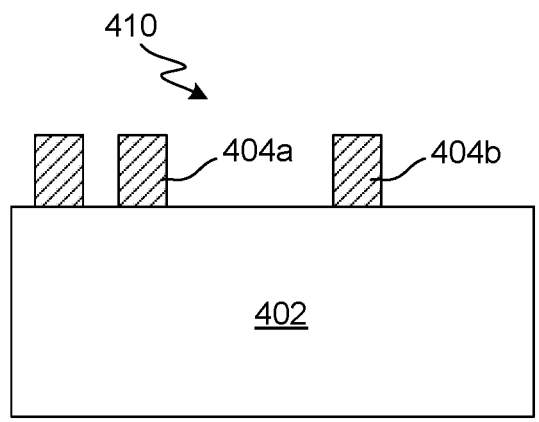
FIGS. 4A-4C are schematic illustrations of isolated and dense substrate features undergoing deposition and etch using a conventional deposition process in a plasma chamber.
Figure 4B:
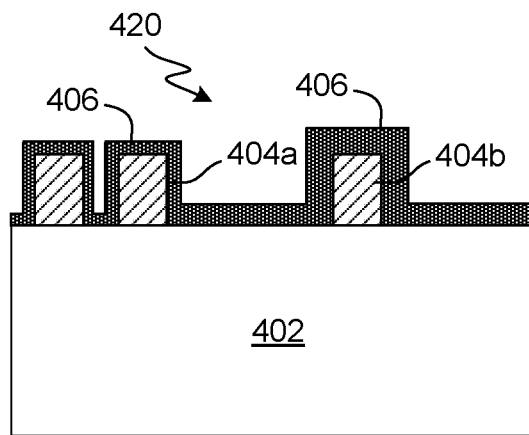
Figure 4C:
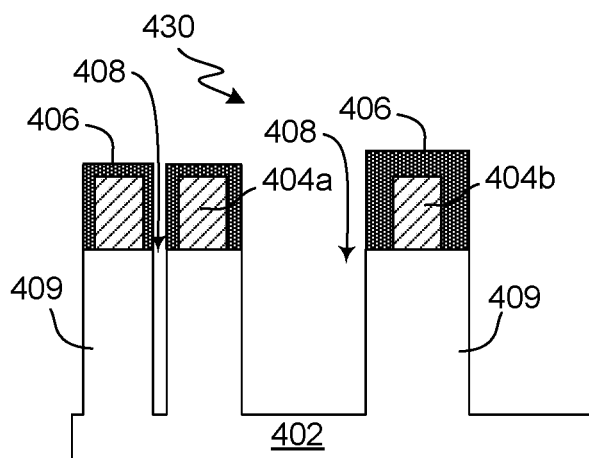

FIGS. 4A-4C are schematic illustrations of isolated and dense substrate features undergoing deposition and etch using a conventional deposition process in a plasma chamber. The deposition and etch operations may correspond to the deposition and etch operations discussed in FIG. 3 on a mask for reducing roughness.

FIG. 4A shows a partially fabricated device structure 410 including a substrate 402 and a mask pattern of features 404a, 404b. The mask pattern of features 404a, 404b may be patterned and defined following an etch in a plasma chamber. The mask pattern of features 404a, 404b may be differentiated between dense features 404a in a dense feature region of the substrate 402 and isolated features 404b in an isolated feature region of the substrate 402, the dense features 404a having a greater feature density than the isolated features 404b. The dense features 404a in the dense feature region may define gaps having a higher aspect ratio than the isolated features 404b in the isolated feature region. The mask pattern of features 404a, 404b may have the same or substantially similar CD as shown in FIG. 4A.

FIG. 4B shows a partially fabricated device structure 420 including the substrate 402, the mask pattern of features 404a, 404b, and a first passivation layer 406 deposited on the mask pattern of features 404a, 404b. The first passivation layer 406 may be deposited using a conventional deposition process in the plasma chamber, such as CVD or PECVD. Alternatively, the first passivation layer 406 may be deposited using a plasma-based "flash" passivation technique, where part of the mask pattern of features 404a, 404b may be consumed through oxidation or nitridation. As shown in FIG. 4B, a thickness of the first passivation layer 406 is greater on the isolated features 404b in the isolated feature region than on the dense features 404a in the dense feature region. The isolated features 404b receive more deposition than the dense features 404a. Therefore, the CD gain is more in the isolated feature region than in the dense feature region. The partially fabricated device structure 420 represents the device structure 410 after deposition using a conventional deposition process in the plasma chamber.

FIG. 4C shows a partially fabricated device structure 430 including the substrate 402, the mask pattern of features 404a, 404b, the first passivation layer 406 deposited on the mask pattern of features 404a, 404b, and a plurality of features 408 within the substrate 402. The plurality of features 408 may be formed following an etch process in the plasma chamber. The etch process may anisotropically etch a layer of material in the substrate 402 to a desired depth. The plurality of features 408 may be defined by a plurality of structures 409 underlying the mask pattern of features 404a, 404b. An aspect ratio of the features 408 may be higher in the dense feature region than in the isolated feature region of the substrate 402. As shown in FIG. 4C, CD bias or CD loading in the isolated feature region is greater than the CD bias or CD loading in the dense feature region. The partially fabricated device structure 430 represents the device structure 420 after etching in the plasma chamber.

In-Situ ALD and Etch for Reducing Roughness

Implementations of the present disclosure relate to a method of reducing roughness using in-situ ALD and etch. In some implementations, in-situ ALD and etch operations may be performed by depositing a conformal layer on a mask and etching a layer underlying the mask to form features with reduced LWR and/or LER. In some implementations, in-situ ALD and etch operations may be performed by depositing a passivation layer on one or more structures and etching a layer underlying the one or more structures to form high aspect ratio features having improved sidewall roughness. In some implementations, the cycles of ALD and etch steps are performed in a plasma processing apparatus as described in FIG. 1. The cycles of ALD performed in the same plasma processing apparatus as etch provide conformal deposition that is used to reduce roughness in features of semiconductor devices.

ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. Unlike a CVD technique, ALD processes use surface-self-limited deposition reactions to deposit films on a layer-by-layer basis. A typical ALD cycle may include: (i) dosing that delivers and adsorbs precursor material onto a substrate surface, (ii) purging excess precursor material from the chamber and leaving a self-limited monolayer on the substrate surface, (iii) delivery of reactant material to react with the adsorbed precursor material, and (iv) purging of unreacted material or reaction byproducts from the chamber. The dose step may adsorb precursor material in a self-limiting manner such that once active sites are occupied by the precursor material, little or no additional precursor material will be adsorbed on the substrate surface. The reactant material may likewise react with the precursor material in a self-limiting or adsorption-limiting manner. Purge steps may be optionally performed to remove excess precursor material, reaction byproducts, and/or unreacted reactant material from the chamber, thereby completing an ALD cycle. ALD may be used to provide highly conformal films with high step coverage even in high aspect ratio features. Accordingly, uniform amounts of material may be deposited between isolated and dense features to minimize CD loading between isolated and dense features.

Figure 5A:
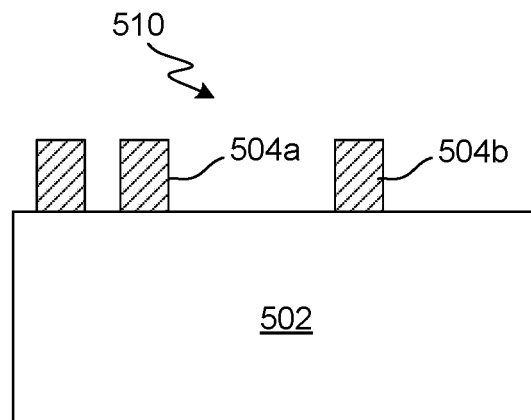
FIGS. 5A-5C are schematic illustrations of isolated and dense substrate features undergoing deposition and etch using ALD and etch processes according to some implementations.
Figure 5B:
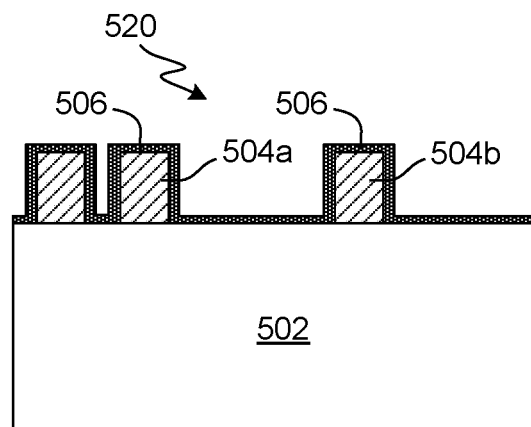
Figure 5C:
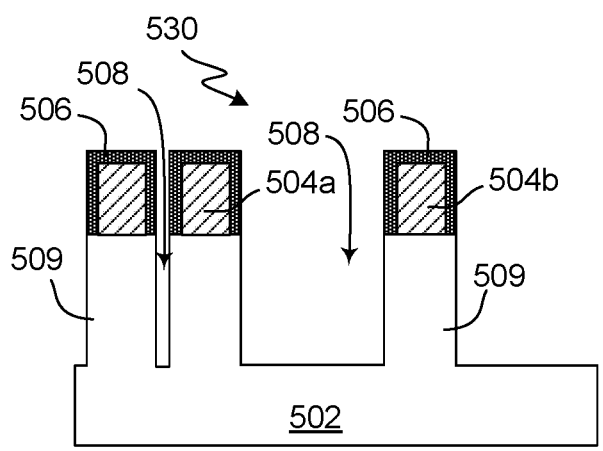

FIGS. 5A-5C are schematic illustrations of isolated and dense substrate features undergoing deposition and etch using ALD and etch processes according to some implementations. A comparison between isolated and dense features in a conventional etch-dep-etch process shown in FIGS. 4A-4C and an ALD etch-dep-etch process shown in FIGS. 5A-5C reveals the effects of CD bias/loading in iso-dense features.

FIG. 5A shows a partially fabricated device structure 510 including a substrate 502 and a mask pattern of features 504a, 504b. The mask pattern of features 504a, 504b may be patterned and defined following an etch in a plasma chamber. The mask pattern of features 504a, 504b may be differentiated between dense features 504a in a dense feature region of the substrate 502 and isolated features 504b in an isolated feature region of the substrate 502, the dense features 504a having a greater feature density than the isolated features 504b. The dense features 504a in the dense feature region may define gaps having a higher aspect ratio than the isolated features 504b in the isolated feature region. The mask pattern of features 504a, 504b may have the same or substantially similar CD as shown in FIG. 5A.

FIG. 5B shows a partially fabricated device structure 520 including the substrate 502, the mask pattern of features 504a, 504b, and a first passivation layer 506 conformally deposited on the mask pattern of features 504a, 504b. The first passivation layer 506 may be deposited using an ALD process. As shown in FIG. 5B, a thickness of the first passivation layer 506 is relatively uniform on the isolated features 504b in the isolated feature region and on the dense features 504a in the dense feature region. As shown in FIG. 5B, the CD bias/loading between the dense features 504a in the dense feature region and the isolated features 504b in the isolated feature region is the same or substantially similar. With respect to CD bias/loading between the dense features 504a and the isolated features 504b using ALD, "substantially similar" throughout this disclosure refers to values within 0.5 nm of a stated value. The partially fabricated device structure 520 represents the device structure 510 after deposition using an ALD process. In some implementations, the ALD process may be an in-situ ALD process performed in the same chamber as a subsequent etch process.

FIG. 5C shows a partially fabricated device structure 530 including the substrate 502, the mask pattern of features 504a, 504b, the first passivation layer 506 conformally deposited on the mask pattern of features 504a, 504b, and a plurality of features 508 within the substrate 502. The plurality of features 508 may be formed following an etch process in the plasma chamber. The etch process may anisotropically etch a layer of material in the substrate 502 to a desired depth. The plurality of features 508 may be defined by a plurality of structures 509 underlying the mask pattern of features 504a, 504b. An aspect ratio of the features 508 may be higher in the dense feature region than in the isolated feature region of the substrate 502. As shown in FIG. 5C, CD bias/loading between the dense feature region and the isolated feature region is the same or substantially similar. The partially fabricated device structure 530 represents the device structure 520 after etching in the plasma chamber.

It will be understood that implementations of the present disclosure for reducing roughness may be performed using ex-situ or in-situ ALD. While implementations using ex-situ ALD and etch may reduce roughness, including LWR and LER, ex-situ ALD and etch may have undesirable consequences and impact on the resulting semiconductor device.

FIG. 6A shows an example process flow for substrate transport using etch and ex-situ ALD processes. It will be understood that such a process flow in FIG. 6A is not limited to multiple patterning schemes as discussed above, but may apply to other schemes using etch and ALD processes. In FIG. 6A, a substrate is provided in an etch chamber and undergoes an etch step at block 601, transferred to a clean chamber to undergo a clean step at block 603, transferred to an ALD chamber to undergo an ALD step at block 605, transferred back to the same or different clean chamber to undergo a clean step at block 607, and transferred back to the same or different etch chamber at block 609. In performing an etch-dep-etch sequence, a substrate may undergo 4 substrate transfers through 3-5 different chambers. In some implementations, the etch step at block 601 may define a mask, the ALD step at block 605 may reduce a roughness of the mask, and the etch step at block 609 may define a structure with a reduced roughness.

The use of separate chambers for deposition and etch increases processing time, processing steps, and costs, thereby having an adverse impact on throughput. Furthermore, the use of separate chambers requires transporting substrates from one chamber to another chamber, which entails vacuum breaks and increases the likelihood of unwanted materials or particles coming into contact with the substrates. This may result in the loss of material functionality and/or integrity on the substrate. Moreover, as shown in FIG. 6A, a clean process is generally required between etch and deposition processes, where the clean process can affect material properties and structure on the substrate. For example, a dilute hydrofluoric (HF) acid clean process has an impact on mask structures and can adversely impact performance.

To reduce roughness while avoiding the problems associated with performing etch steps and deposition steps in different tools, a plasma etch chamber may be utilized and adapted to perform deposition. Typical deposition processes may include CVD and PECVD processes. However, as discussed above, such deposition processes typically deposit films that are not conformal. More specifically, the deposition processes are dependent on aspect ratio and deposit more material in more open spaces or wider pitches, resulting in non-uniform deposition across structures or features of different aspect ratios. Accordingly, more deposition would take place in isolated features than in dense features, where a CD bias for isolated features is greater than a CD bias for dense features.

Some implementations of the present disclosure relate to the integration of ALD steps and etch steps in a plasma chamber. By using in-situ ALD rather than ALD conducted in a separate chamber and rather than using CVD/PECVD in the same chamber, standalone ALD tools and additional cleaning tools are eliminated. Furthermore, processing time and costs are reduced by eliminating additional substrate transfers and clean time. In addition, using in-situ ALD avoids vacuum breaks between substrate transfers (e.g., between ex-situ deposition and clean), which may expose the substrate to unwanted materials, atmosphere, and/or moisture. Using in-situ ALD also reduces the impact of non-uniform deposition across structures or features of different aspect ratios. In-situ ALD may refer to the ALD performed in a plasma etch chamber, such as a plasma chamber in the processing apparatus 100 of FIG. 1 described above.

FIG. 6B shows an example process flow for substrate transport using integrated etch and ALD processes. It will be understood that such a process flow in FIG. 6B is not limited to multiple patterning schemes as discussed above, but may apply to other schemes using etch and ALD processes. In FIG. 6B, a substrate is provided in an etch chamber and undergoes an etch step at block 651, maintained in the same etch chamber to undergo an ALD step at block 653, maintained in the same etch chamber to undergo an etch step at block 655, and transferred to a clean chamber to undergo a clean step at block 657. In performing an etch-dep-etch sequence, a substrate may undergo 1 substrate transfer through 2 different chambers. In some implementations, the etch step at block 651 may define a mask, the ALD step at block 653 may reduce a roughness of the mask, and the etch step at block 655 may define a structure with a reduced roughness.

Figure 7:
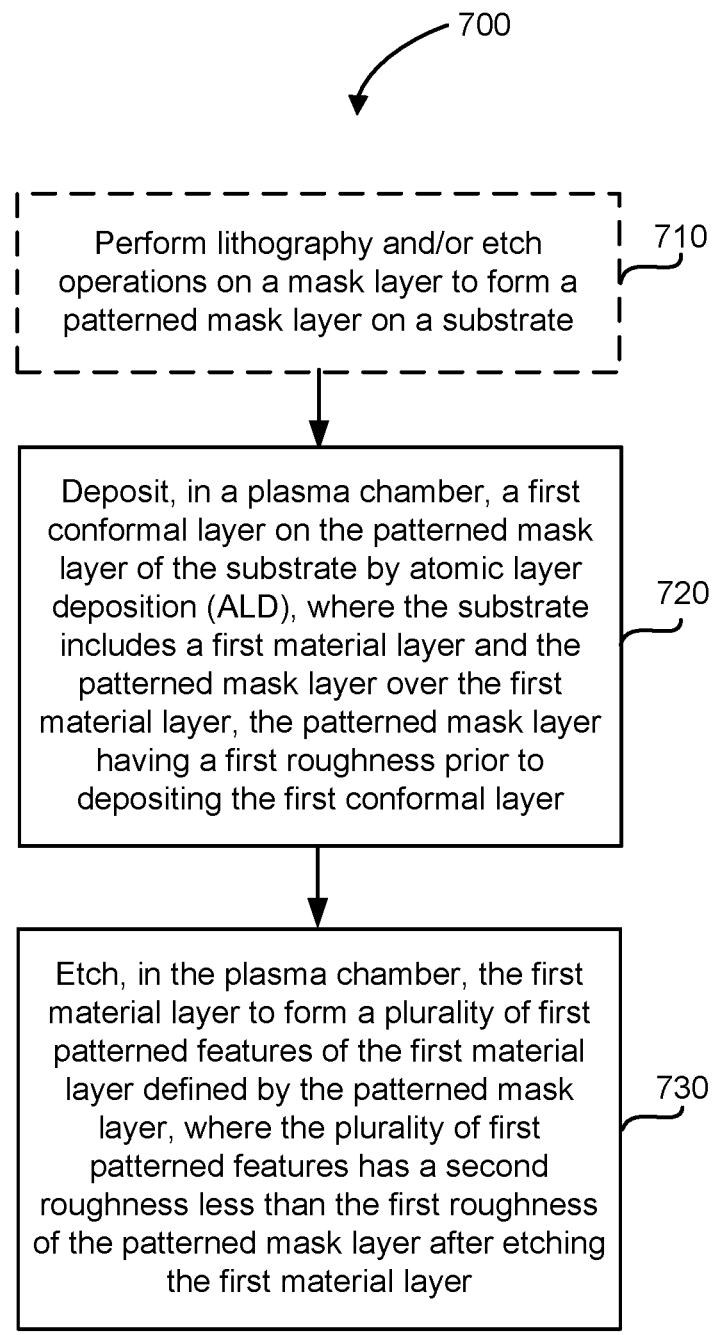
FIG. 7 is a flow diagram of an example method for reducing roughness in patterned features using etch and ALD processes according to some implementations.

FIG. 7 is a flow diagram of an example method for reducing roughness in patterned features using etch and ALD processes according to some implementations. The operations in a process 700 may be performed in different orders and/or with different, fewer, or additional operations. FIG. 7 is described with reference to FIGS. 8A-8D.

At block 710 of the process 700, lithography and/or etch operations are optionally performed on a mask layer to form a patterned mask layer on a substrate. Lithography operations may include exposure and development operations performed on a resist material of a mask layer. Etch operations may remove portions of the mask layer such as one or more feet laterally protruding in the mask layer. In some implementations, the mask layer can include a photoresist material. The patterned mask layer may have a certain amount of roughness following the lithography and/or etch operations. In the process 700, the in-situ ALD and etch operations of the present disclosure are performed after the lithography and/or etch operations form the patterned mask layer.

In some implementations, the patterned mask layer includes a photoresist material. In some implementations, the patterned mask layer includes a hard mask material. Examples of hard mask material include but are not limited to silicon oxide, silicon nitride, or silicon oxynitride. Though the patterned mask layer may include a resist material, it will be understood that the patterned mask layer does not necessarily include a resist material. In some implementations, the patterned mask layer may be defined following a single or multi-patterning process. A resist or photoresist layer may serve as a mask to define one or more underlying structures in a patterning process, where the one or more underlying structures may serve as the patterned mask layer for subsequent in-situ ALD and etch operations. Or, the one or more underlying structures may serve as a mask to define additional underlying structures that may serve as the patterned mask layer described at block 710. This means that the patterned mask layer used with in-situ ALD and etch may be formed at any point during a single or multi-patterning process. This may occur because the in-situ ALD and etch operations described below in the process 700 may not be compatible with certain resist material or other materials of a substrate.

In some implementations, the patterned mask layer on the substrate may be configured to define one or more one-dimensional (1-D) features in an underlying material layer and one or more two-dimensional (2-D) features in the underlying material layer. Accordingly, the patterned mask layer may be patterned with 1-D and 2-D structures for defining 1-D and 2-D features in the underlying material layer. 1-D features may be defined with respect to a single direction and examples of 1-D features may include interconnect lines and trenches. 2-D features may be defined with respect to two orthogonal directions and examples of 2-D features may include contact holes, vias, squares, and blocks.

In some implementations, the patterned mask layer may have one or more isolated features in an isolated feature region and one or more dense features in a dense feature region, where the dense feature region has a greater feature density than the isolated feature region. The one or more dense features may provide features (e.g., trenches, recesses, holes, etc.) with higher aspect ratios than the one or more isolated features.

The patterned mask layer may have a roughness associated with it, where edges of patterns in the patterned mask layer have deviations from linearity. This may be expressed by LER and/or LWR values. In some implementations, the LER values of the patterned mask layer for a given inspection area may be greater than about 3.0 nm or greater than about 1.0 nm, and the LWR values of the patterned mask layer for a given inspection area may be greater than about 4.0 nm, greater than about 3.0 nm, or greater than about 1.5 nm. It will be understood, however, that the LER values and the LWR values of the patterned mask layer may depend on the patterns formed in the patterned mask layer.

Figure 8A:
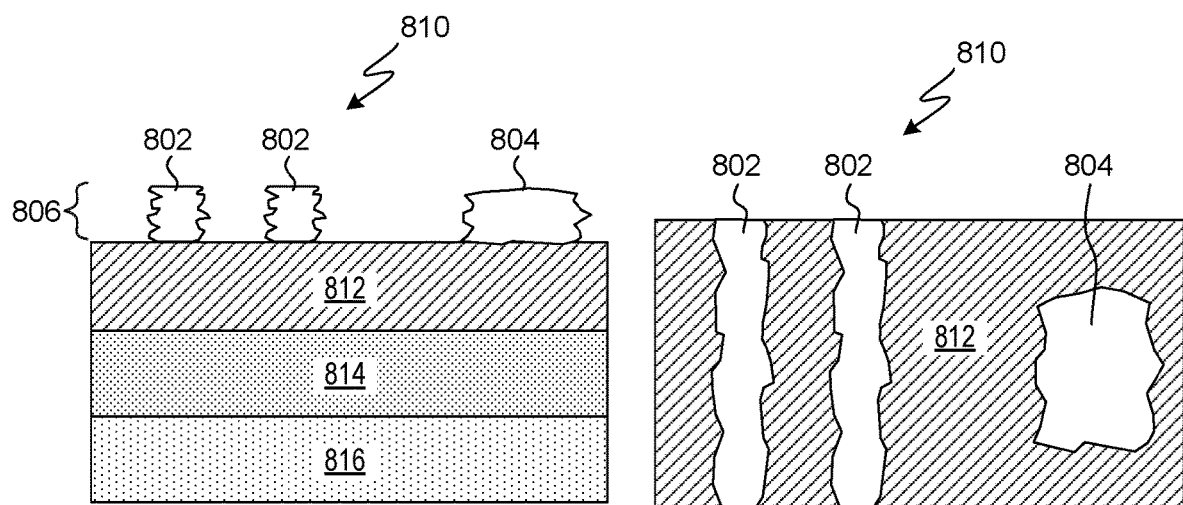
FIGS. 8A-8D are schematic illustrations showing a side view and a top view of an example method for patterning one-dimensional (1-D) and two-dimensional (2-D) features using integrated etch and ALD processes according to some implementations.

FIG. 8A is a schematic illustration showing a side view and a top view of an example partially fabricated semiconductor device with a patterned mask layer and underlying material layers. A partially fabricated semiconductor device 810 includes a patterned mask layer 806 where the patterned mask layer 806 includes 1-D structures 802 and a 2-D structure 804. The 1-D structures 802 may define lines in an underlying layer and the 2-D structure 804 may define a block in the underlying layer. Though the patterned mask layer 806 is used to form structures directly underneath the patterned mask layer 806, the pattern in the patterned mask layer 806 may be reversed to obtain trenches and/or holes instead of lines and blocks in FIGS. 8A-8D. The partially fabricated semiconductor device 810 includes a first material layer 812 underlying the patterned mask layer 806, a second material layer 814 underlying the first material layer 812, and a third material layer 816 underlying the second material layer 814. Each of the material layers 812, 814, and 816 may include a semiconductor material, a dielectric material, or a conductive material. A composition of the first material layer 812 is different than a composition of the second material layer 814, and the composition of the second material layer 814 is different than a composition of the third material layer 816. As shown in FIG. 8A, a profile of the 1-D structures 802 and a profile of the 2-D structure 804 show jagged edges and other non-linearities indicative of roughness in the patterned mask layer 806. In some implementations, roughness in the patterned mask layer 806 may be calculated by calculating LWR and/or LER values after defining a given inspection length or area. A typical inspection length is greater than about 50 nm or greater than about 100 nm. Without smoothing the roughness of the patterned mask layer 806, the roughness is transferred to subsequent layers in the partially fabricated semiconductor device 810 and degrades performance.

Returning to FIG. 7, at block 720 of the process 700, a first conformal layer is deposited on the patterned mask layer of the substrate by atomic layer deposition (ALD) in a plasma chamber. The substrate includes a first material layer and the patterned mask layer over the first material layer. The patterned mask layer has a first roughness prior to depositing the first conformal layer. The plasma chamber may also be configured to perform subsequent etch processes. Aspects of the plasma chamber may be described with respect to the processing apparatus 100 in FIG. 1.

In some implementations of the process 700, the substrate is provided in the plasma chamber. The substrate may be positioned on a substrate support in the plasma chamber. In some implementations, the substrate can be a semiconductor substrate, such as a 200-mm, 300-mm, or 450-mm substrate, including silicon substrates. In some implementations, the substrate is provided in the plasma chamber with the patterned mask layer.

The first conformal layer may be deposited by ALD on exposed surfaces of the patterned mask layer and the first material layer underlying the patterned mask layer. The exposed surfaces of the patterned mask layer include sidewalls of features of the patterned mask layer. The first conformal layer on the patterned mask layer smooths out the rough edges and crevices of the patterned mask layer, thereby reducing the first roughness associated with the patterned mask layer.

In some implementations, the first conformal layer includes a passivating material such as an oxide or nitride. For example, the first conformal layer includes silicon oxide ($SiO_x$). The passivating material of the first conformal layer may serve to protect the patterned mask layer, including sidewalls of the patterned mask layer, during a subsequent etch process such as an etch process described at block 730.

In some implementations, the first conformal layer is relatively thin and has a thickness that is sufficient to reduce the first roughness associated with the patterned mask layer. For example, the first conformal layer has a thickness between about 0.2 nm and about 10 nm or between about 0.5 nm and about 5 nm.

As described above, ALD is a technique that deposits thin layers of material using sequential self-limiting reactions. ALD may be used to provide highly conformal films with high step coverage even in high aspect ratio features. The first conformal layer is conformally deposited by ALD and may have a high step coverage, such as a step coverage of greater than 85%, greater than 90%, or greater than 95%. The ALD process for depositing the first conformal layer may occur in one or more cycles, where each cycle produces an adsorption-limited amount of material on the patterned mask layer. Each cycle may include a dose step where a controlled amount of precursor material is delivered to a substrate surface to adsorb on the substrate surface in a self-limiting manner. This is also known as "soaking" the substrate surface to saturation. Each cycle may further include a conversion step following the dose step where reactant material is provided to react with the precursor material on the substrate surface and form an adsorption-limited amount of material (e.g., passivating material). The reactant material may include a reactant gas, where an RF power source generates plasma of the reactant gas in the plasma chamber. The reactant gas may include, for example, an oxygen-containing gas (e.g., $O_2$) or a nitrogen-containing gas (e.g., $N_2$ or $NH_3$). Radicals and other charged species of the reactant gas react with the precursor material to convert the precursor material to the adsorption-limited amount of material (e.g., passivating material). In some implementations, the reactant gas is exposed to RF power delivery in a relatively short amount of time, such as between about 0.5 seconds and about 5 seconds, to form the plasma to convert the precursor material. This is also known as a "flash" operation to convert the precursor material on the substrate surface using plasma from RF power delivered in a relatively short amount of time. In some implementations, a purge step may remove excess precursor material, reaction byproducts, and/or unreacted reactant material from the plasma chamber to complete the cycle. In some implementations, the dose step and the conversion step may be repeated until a desired thickness of the first conformal layer is deposited.

Deposition of the first conformal layer is independent of aspect ratio and pitch. A thickness of the first conformal layer on the patterned mask layer is relatively uniform so that approximately the same amount of material is deposited across different CDs, different aspect ratios, different pitches, different depths, and different 1-D/2-D features. This minimizes CD loading, depth loading, and 1-D/2-D CD bias loading. For example, a CD bias between one or more 1-D features and one or more 2-D features is substantially similar after depositing the first conformal layer. A CD bias between one or more isolated features and one or more dense features is substantially similar after depositing the first conformal layer. With respect to CD bias between 1-D/2-D features and iso-dense features, "substantially similar" throughout this disclosure refers to values within plus or minus 5% of a stated value.

Figure 8B:
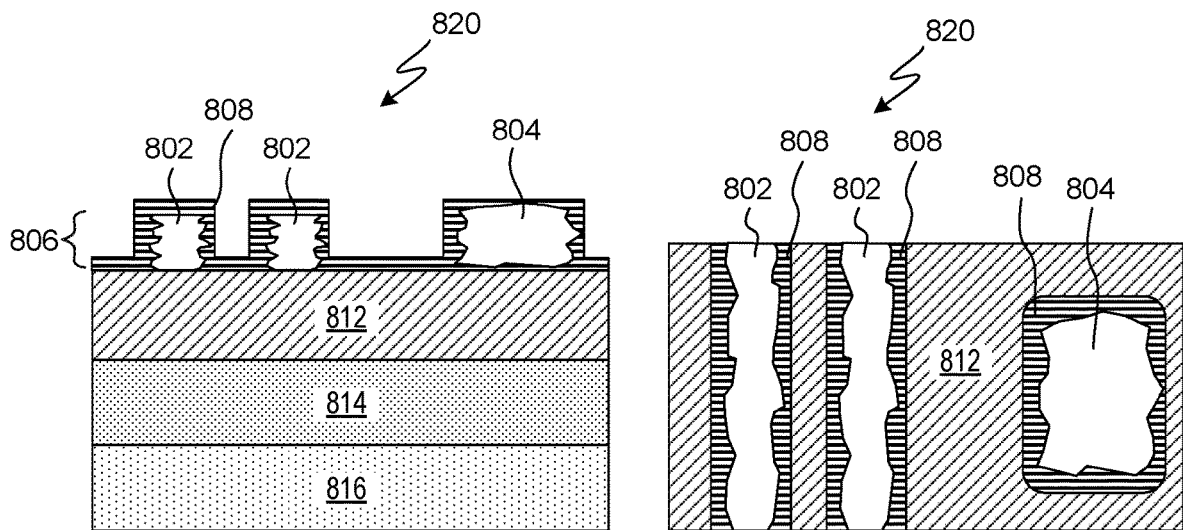

FIG. 8B is a schematic illustration showing a side view and a top view of an example partially fabricated semiconductor device from FIG. 8A after deposition of a first conformal layer on the patterned mask layer. A partially fabricated semiconductor device 820 includes the patterned mask layer 806 with a first conformal layer 808 deposited thereon. The first conformal layer 808 is deposited on exposed surfaces of the patterned mask layer 806 and the first material layer 812, including sidewalls and top surfaces of the patterned mask layer 806 and the first material layer 812. The first conformal layer 808 provides a relatively linear profile to cover the profile of the 1-D structures 802 and the profile of the 2-D structures 804. The jagged edges and other non-linearities of the 1-D structures 802 and the 2-D structures 804 are corrected by the first conformal layer 808. The roughness in the patterned mask layer 806 is reduced by the first conformal layer 808. In some implementations, the LWR and/or LER values of the patterned mask layer 806 are reduced by the first conformal layer 808 for the same inspection length or area as the LWR and/or LER values calculated on the patterned mask layer 806 prior to depositing the first conformal layer 808. Not only does the first conformal layer 808 improve roughness in the patterned mask layer 806, but roughness is improved with negligible impact on CD bias/loading and depth bias/loading. A same or substantially similar thickness of the first conformal layer 808 is deposited on exposed surfaces of the partially fabricated semiconductor device 820 independent of aspect ratio, pitch, depth, and 1-D/2-D CD. In some implementations, the first conformal layer 808 has a thickness between about 0.5 nm and about 5 nm and includes silicon oxide ($SiO_x$).

Returning to FIG. 7, at block 730 of the process 700, the first material layer is etched in the plasma chamber to form a plurality of first patterned features of the first material layer defined by the patterned mask layer. The plurality of first patterned features has a second roughness less than the first roughness of the patterned mask layer after etching the first material layer. The etch operation at block 730 may be performed in the same plasma chamber as deposition at block 720 without introducing a vacuum break in between operations.

The etch may be an anisotropic etch through the first material layer to form features in the first material layer. The etch may be selective to etch material of the first material layer over material of surrounding layers. That way the etch performed at block 730 selectively etches the first material layer without etching the first conformal layer and/or the patterned mask layer. In some implementations, the etch may remove the first material layer to a first depth, where the first depth is less than a final depth. For example, the first depth may be any suitable percentage of the final depth, such as 20%, 30%, 40%, 50%, 60%, etc. of the final depth. Thus, multiple etches may be performed to reach the final depth.

Deposition of the first conformal layer to smooth out the first roughness of the patterned mask layer eliminates or minimizes roughness (i.e., the first roughness) from being transferred to underlying material layers. Roughness may be improved so that LWR and/or LER values corresponding to the second roughness are less than the LWR and/or LER values corresponding to the first roughness. In some implementations, LWR and/or LER values from the first roughness to the second roughness may be improved by at least 30%, at least 40%, at least 50%, at least 60%, or at least 75%. For example, a 40% improvement in roughness is demonstrated where an LWR value is 2.5 nm on the patterned mask layer and an LWR value is 1.5 nm on the plurality of first patterned features over a given inspection length/area following ALD and etch. In some implementations, an LWR value associated with the second roughness is equal to or less than about 2.0 nm or 1.5 nm for a given inspection length/area, and an LER value associated with the second roughness is equal to or less than about 2.0 nm or 1.5 nm for a given inspection length/area. This is in contrast to the LWR value associated with the first roughness being equal to or greater than about 2.5 nm or 2.0 nm for the same inspection length/area, and the LER value associated with the first roughness being equal to or greater than about 2.5 nm or 2.0 nm for the same inspection length/area. In some implementations, a CD of the plurality of first patterned features is equal to or less than about 20 nm.

The plurality of first patterned features may include various geometric features, including but not limited to interconnect lines, contacts, vias, trenches, recesses, spaces, holes, blocks, squares, etc. The plurality of first patterned features may include 1-D and/or 2-D features. Though the CD of the plurality of first patterned features may refer to structures (e.g., lines, blocks), it will be understood that the relevant CD may be a space CD for spaces (e.g., recesses, holes).

An improvement in roughness in underlying material layers is achieved with minimal impact on through pitch loading. Just as deposition of the first conformal layer is independent of aspect ratio and pitch to minimize impact on CD loading, depth loading, and 1-D/2-D CD bias loading, the etching of the first material layer to form the plurality of first patterned features has minimal impact on CD loading, depth loading, and 1-D/2-D CD bias loading. Accordingly, a CD bias between one or more isolated features and one or more dense features is substantially similar after etching the first material layer, and a CD bias between one or more 1-D features and one or more 2-D features is substantially similar after depositing the first conformal layer. Accordingly, the patterned mask layer transfers the pattern to defining the plurality of first patterned features in the first material layer with less roughness and without CD bias loading.

The improvement in roughness in underlying material layers is achieved with minimal impact on selectivity and throughput. In contrast to applications that use a plasma treatment method on the mask to reduce roughness, deposition of the first conformal layer by ALD and subsequent etch does not impact the chemistry of the patterned mask layer to influence its selectivity. Deposition of the first conformal layer by ALD also does not impact a shape of the patterned mask layer, which may occur in a plasma treatment method to reduce roughness. Moreover, in contrast to applications that use lithography optimization such as dose optimization and/or resist optimization, deposition of the first conformal layer by ALD and subsequent etch does not require long cycle times to adversely impact throughput. Instead, reducing roughness by ALD and subsequent etch may be performed without changing conditions or parameters of a lithography process.

In some implementations, the etch operation performed at block 730 is not selective to the first conformal layer so that the first conformal layer is preserved during etching. The first conformal layer may be etched at a substantially slower etch rate than the first material layer. In some implementations, the etch operation performed at block 730 is selective to the first conformal layer during etching. The first conformal layer may not necessarily include a passivating material to resist the etching operation at block 730. A certain thickness of the first conformal layer may be consumed by the etch at block 730. CD gain from deposition of the first conformal layer may be removed or controlled by the etch.

In some implementations, a dep-etch sequence following the etch operation at block 730 is repeated until a desired depth or final depth is reached. The dep-etch sequence may be repeated through the first material layer, the second material layer, or the third material layer, and so forth. The process 700 can further include depositing a second conformal layer by ALD on exposed surfaces of the plurality of first patterned features, the patterned mask layer, and the second material layer, and etching the second material layer of the substrate to form a plurality of second patterned features defined by the plurality of first patterned features. The plurality of second patterned features can have a third roughness less than each of the first roughness and the second roughness. The third roughness may correspond to certain LWR/LER values. In some implementations, an LWR value associated with the third roughness is equal to or less than about 2.0 nm, 1.5 nm, or 1.0 nm for the inspection length/area of the first and second roughness, and an LER value associated with the third roughness is equal to or less than about 2.0 nm, 1.5 nm, or 1.0 nm for the inspection length/area of the first and second roughness. In some implementations, deposition of the second conformal layer by ALD and etching the second material layer may be performed in the same plasma chamber as deposition at block 720 and etch at block 730 without introducing a vacuum break in between operations. Repeating in-situ ALD and etch operations may lead to continual LWR/LER improvement without CD bias loading.

Figure 8C:
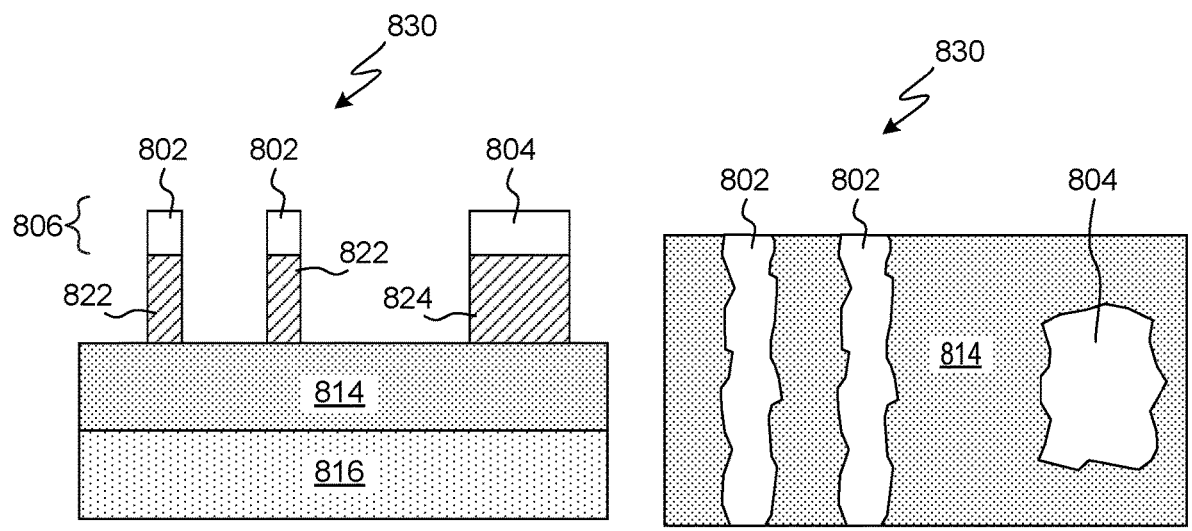

FIG. 8C is a schematic illustration showing a side view and a top view of an example partially fabricated semiconductor device from FIG. 8B after etching a first material layer to form a plurality of first patterned features. A partially fabricated semiconductor device 830 includes the patterned mask layer 806 and a plurality of first patterned features 822, 824 underlying and defined by the patterned mask layer 806. The plurality of first patterned features 822, 824 are formed from the first material layer 812 in FIGS. 8A-8B by an etch selective to the first material layer 812. The etch is not selective in removing the second material layer 814 or the patterned mask layer 806. The etch may be performed in the same plasma chamber as the deposition of the first conformal layer 808 in FIG. 8B. The plurality of first patterned features 822, 824 may include 1-D features 822 defined by the 1-D structures 802 and a 2-D feature 824 defined by the 2-D structure 804. In some implementations, the 1-D features 822 include interconnect lines and the 2-D feature 824 includes a block or contact via. The plurality of first patterned features 822, 824 has less roughness than the patterned mask layer prior to depositing the first conformal layer 808. In some implementations, the LWR and/or LER values over the same given inspection length or area as the patterned mask layer are improved in the plurality of first patterned features 822, 824. Though the plurality of first patterned features 822, 824 may exhibit some roughness in FIG. 8C, the pattern transferred to the plurality of first patterned features 822, 824 has less roughness than its mask. In some implementations, the first conformal layer 808 is removed after etching the first material layer 812. Roughness is improved in the plurality of first patterned features 822, 824 with negligible impact on CD bias/loading and depth bias/loading.

Figure 8D:
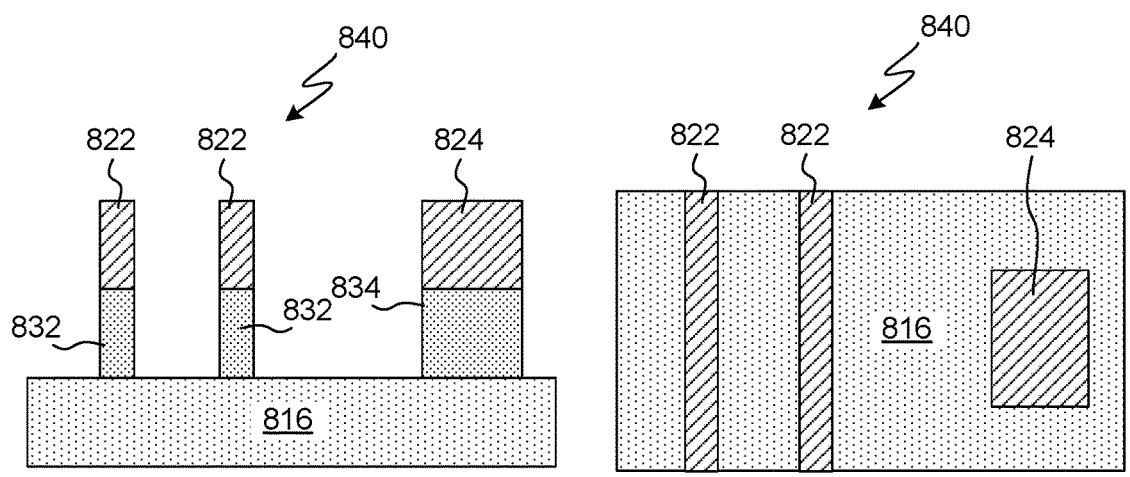

FIG. 8D is a schematic illustration showing a side view and a top view of an example partially fabricated semiconductor device from FIG. 8C after etching a second material layer to form a plurality of second patterned features. A partially fabricated semiconductor device 840 includes the plurality of first patterned features 822, 824 and a plurality of second patterned features 832, 834 underlying and defined by the plurality of first patterned features 822, 824. The plurality of second patterned features 832, 834 are formed from the second material layer 814 in FIGS. 8A-8C by an etch selective to the second material layer 814. The etch is not selective to the third material layer 816. In some implementations, a dep-etch sequence may be performed in forming the plurality of second patterned features 832, 834. The deposition operation may deposit a second conformal layer (not shown) by ALD on exposed surfaces of the plurality of first patterned features 822, 824 and the second material layer 814. The deposition operation may be performed in the same plasma chamber as the etch operation in FIG. 8C and as the subsequent etch operation in FIG. 8D. The second conformal layer may further reduce the roughness of the plurality of first patterned features 822, 824. That way, roughness in the plurality of first patterned features 822, 824 is prevented from transferring to the plurality of second patterned features 832, 834. However, it will be understood that the deposition operation may be omitted prior to etching the second material layer 814. The plurality of second patterned features 832, 834 may include 1-D features 832 and a 2-D feature 834. In some implementations, the LWR and/or LER values over the same given inspection length or area as the plurality of first patterned features 822, 824 are improved in the plurality of second patterned features 832, 834. In some implementations, the patterned mask layer 806 is removed after etching the second material layer 814. Roughness is improved in the plurality of second patterned features 832, 834 with negligible impact on CD bias/loading and depth bias/loading. In some implementations, in-situ ALD and etch operations may be repeated in the partially fabricated semiconductor device 840 until a desired depth or layer is reached while improving LWR/LER. More cycles of in-situ ALD and etch operations may result in reduced LWR/LER values. Alternatively, in-situ ALD and etch operations may be performed at any point when it is desired to reduce LWR/LER in an etch process, such as where in-situ ALD and etch operations are compatible on a different underlying material layer (e.g., third material layer 816). In-situ ALD and etch operations are not necessarily performed for each underlying material layer.

Figure 9A:
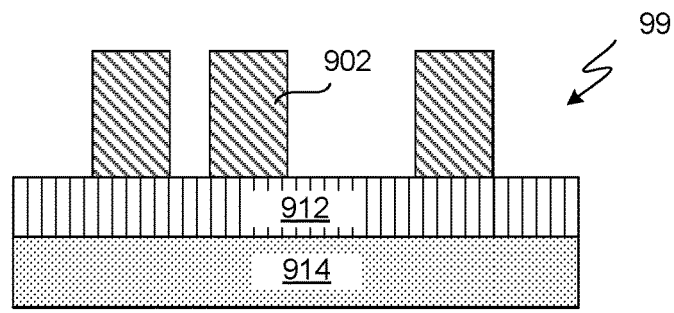
FIGS. 9A-9C are schematic illustrations of an example method for patterning features with a hard mask using integrated etch and ALD processes according to some implementations.
Figure 9B:
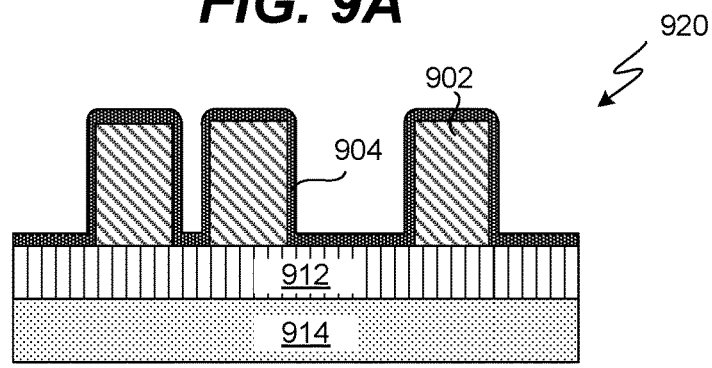
Figure 9C:
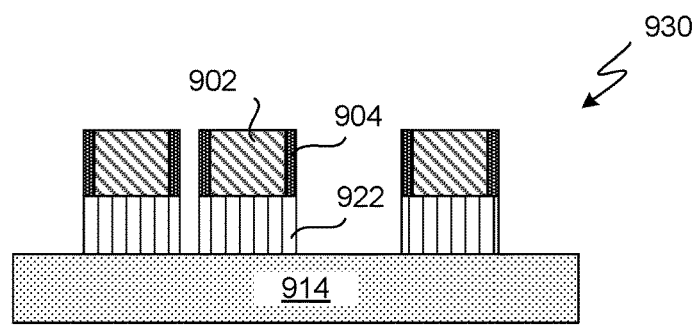
Figure 9D:
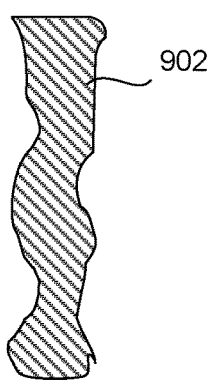
FIG. 9D is a schematic illustration showing a top view of a hard mask used in FIGS. 9A-9C prior to an ALD process.
Figure 9E:
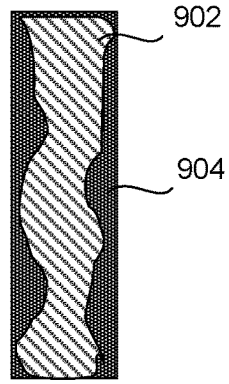
FIG. 9E is a schematic illustration showing a top view of the hard mask in FIG. 9D after the ALD process.

The aforementioned ALD and etch operations for improving roughness may improve roughness on soft masks as well as hard masks. FIGS. 9A-9C are schematic illustrations of an example method for patterning features with a hard mask using integrated etch and ALD processes according to some implementations. FIG. 9D is a schematic illustration showing a top view of a hard mask used in FIGS. 9A-9C prior to an ALD process. FIG. 9E is a schematic illustration showing a top view of the hard mask in FIG. 9D after the ALD process.

A partially fabricated semiconductor device 910 in FIG. 9A includes a hard mask 902, a first material layer 912 underlying the hard mask 902, and a second material layer 914 underlying the first material layer 912. The hard mask 902 may include a hard mask material such as silicon oxide, silicon nitride, or silicon oxynitride. In some implementations, the hard mask 902 may have one or more isolated features in an isolated feature region and one or more dense features in a dense feature region. In FIG. 9D, the hard mask 902 exhibits jagged, non-linear edges with several crevices.

A partially fabricated semiconductor device 920 in FIG. 9B includes the hard mask 902 covered with a conformal layer 904, the first material layer 912 underlying the hard mask 902, and the second material layer 914 underlying the first material layer 912. The conformal layer 904 is deposited using ALD as described above. The conformal layer 904 is deposited by ALD on sidewalls of the hard mask 902 and on top surfaces of the first material layer 912 and the hard mask 902. The conformal layer 904 may be uniformly deposited across the one or more isolated features and the one or more dense features of the hard mask 902. The conformal layer 904 reduces roughness in the hard mask 902 with minimal impact to throughput, selectivity, and through pitch loading. In FIG. 9E, the conformal layer 904 fills in crevices and smooths out jagged, non-linear edges of the hard mask 902.

A partially fabricated semiconductor device 930 in FIG. 9C includes the hard mask 902, patterned features 922 underlying the hard mask 902, and the second material layer 914 underlying the patterned features 922. The patterned features 922 may be formed following an anisotropic etch through the first material layer 912 and defined by the hard mask 902. The anisotropic etch may be performed in the same chamber or tool for depositing the conformal layer 904 in FIG. 9B. In some implementations, the conformal layer 904 may remain on sidewalls of the hard mask 902 following the anisotropic etch. In some implementations, the patterned features 922 may include a conductive material such as tungsten. The conformal layer 904 reduces roughness in the hard mask 902 so that less roughness is transferred to the patterned features 922 after the anisotropic etch. In some implementations, LWR/LER values in the patterned features 922 is less than LWR/LER values in the hard mask 902.

Implementations of the present disclosure may use integrated ALD and etch operations for reducing sidewall roughness in high aspect ratio features. In some implementations, the cycles of ALD and etch steps for reducing sidewall roughness are performed in a plasma processing apparatus as described in FIG. 1.

Sidewall protection is difficult to achieve in high aspect ratio features. Sidewall protection promotes preferential etching at the bottom of a feature as opposed to sidewalls of the feature. Without sidewall protection, the feature begins to assume a non-uniform profile where sidewall protection is inadequate.

A conventional technique for providing sidewall protection involves plasma-based "flash" passivation. A plasma-based "flash" passivation can refer to striking a gas such as oxygen ($O_2$), nitrogen ($N_2$), or sulfur dioxide ($SO_2$) to form a plasma of dissociated radicals to react with a surface and form a passivating layer of material (e.g., oxide or nitride) on the surface. The plasma-based "flash" passivation technique generally minimizes the effect of faceting, erosion of a mask, and undercutting due to lateral etching. The plasma-based "flash" passivation process may consume material on exposed surfaces of the high aspect ratio features to form the passivating layer of material. In some implementations, the gas is exposed to RF power delivery in a relatively short amount of time, such as between about 0.5 seconds and about 5 seconds, to form the plasma for plasma-based "flash" passivation. The dissociated radicals react with the exposed surfaces and form a passivating layer of material that protects the sidewalls of the high aspect ratio features during etch. In some implementations, the plasma in the plasma-based "flash" passivation technique is used to etch underlying material while also reacting with sidewalls of high aspect ratio features to form the passivating layer of material for sidewall protection.

However, deposition using the plasma-based "flash" passivation technique may be dependent on aspect ratio and may be dependent on material. More passivating material may be deposited near an opening of a high aspect ratio feature than near a bottom of the high aspect ratio feature, and more passivating material may be deposited on isolated features than on dense features. An uneven amount of passivating material may be deposited on structures made of different materials. Furthermore, roughness may result on sidewalls of the high aspect ratio features due to an uneven distribution of passivating material forming along the sidewalls of the high aspect ratio features. Roughness on sidewalls of high aspect ratio features may be detrimental to semiconductor device performance (e.g., transistor performance).

Features in a substrate of a semiconductor device may include high aspect ratio features. A high aspect ratio feature is one having an aspect ratio of at least about 5:1, at least about 10:1, at least about 15:1, at least about 20:1, at least about 30:1, at least about 40:1, at least about 50:1, or at least about 100:1. For example, features having a high aspect ratio may be at least 10:1. In some implementations, aspect ratios are measured as a comparison of a depth of a feature to a critical dimension of the feature (often its width/diameter). As used herein, aspect ratios are measured based on the critical dimension proximate an opening of the feature. In some implementations, a critical dimension of the features may be equal to or less than about 20 nm.

A feature as discussed in the context of reducing sidewall roughness is a recess in a surface of a substrate. Features can have many different shapes including but not limited to cylinders, rectangles, squares, other polygonal recesses, trenches, etc.

Forming a high aspect ratio feature of a substrate may occur in multiple etching steps. In other words, the high aspect ratio feature may be formed by etching to a desired depth followed by one or more additional etching steps to reach a final depth. In some implementations, each etch step may etch to a depth of at least 50 nm or at least 100 nm.

Figure 10A:
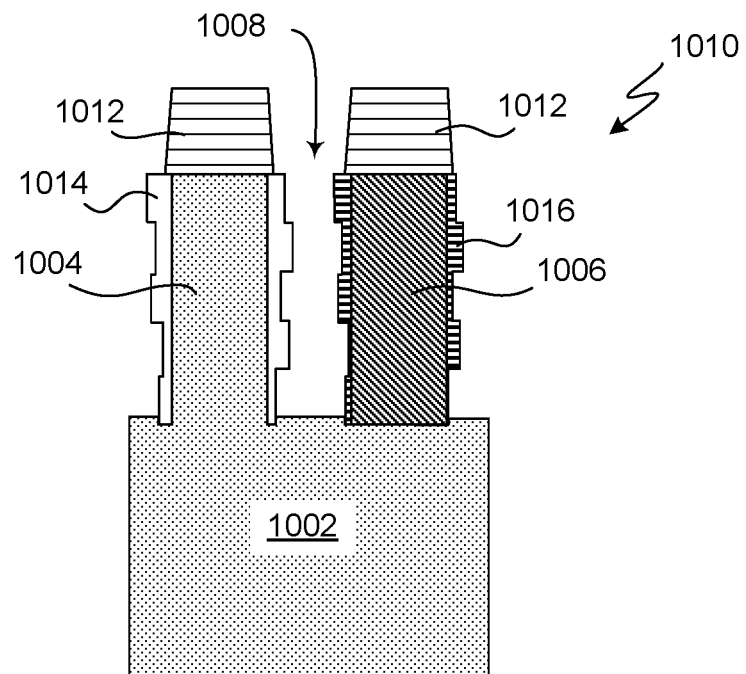
FIGS. 10A-10B are schematic illustrations of high aspect ratio features of different materials undergoing passivation and etch using a conventional passivation process in a plasma chamber.
Figure 10B:
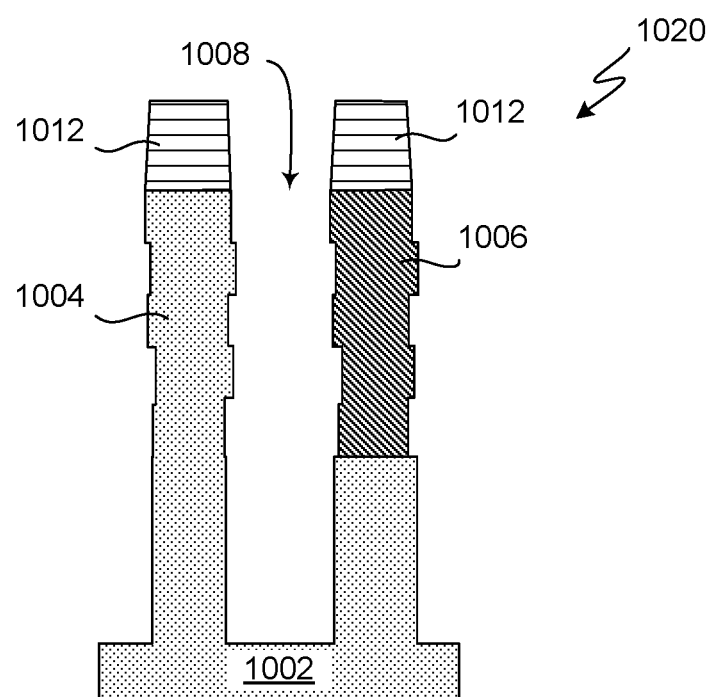

FIGS. 10A-10B are schematic illustrations of high aspect ratio features of different materials undergoing passivation and etch using a conventional passivation process in a plasma chamber. As discussed above, a conventional passivation process in a plasma chamber may include a plasma-based "flash" passivation process as discussed above.

FIG. 10A is a schematic illustration of a partially fabricated semiconductor device 1010 including a substrate 1002, where the substrate 1002 includes a plurality of structures 1004, 1006 defining one or more features 1008. The partially fabricated semiconductor device 1010 may further include a mask 1012 on structures 1004, 1006 for defining the one or more features 1008. The one or more features 1008 are formed or defined following an etch through the substrate 1002 or through a layer (not shown) of the substrate 1002. The etch through the substrate 1002 may etch the one or more features 1008 to a depth of 50 nm or greater, or 100 nm or greater. In some implementations, the partially fabricated semiconductor device 1010 may be a transistor device such as a fin field effect transistor (FinFET) device. The structures 1004, 1006 may serve as fins of a FinFET device. In some implementations, the structures 1004, 1006 may include a semiconducting material such as silicon, germanium, or combinations thereof. For example, the plurality of structures 1004, 1006 may include a first structure 1004 having a first material and a second structure 1006 having a second material, where the first material includes silicon and the second material includes silicon-germanium. In some implementations, the one or more features 1008 are shallow trench isolation (STI) features of the partially fabricated semiconductor device 1010.

In FIG. 10A, a first passivation layer 1014 is formed on sidewalls of the first structure 1004 and a second passivation layer 1016 is formed on sidewalls of the second structure 1006. The first passivation layer 1014 and the second passivation layer 1016 may be formed using a conventional passivation process such as a plasma-based "flash" passivation technique described above. For example, an oxygen "flash" passivation technique may use an oxygen plasma to react with material on the sidewalls of the first structure 1004 and the sidewalls of the second structure 1006 to produce an oxide passivating material for the first passivation layer 1014 and the second passivation layer 1016. Each of the first passivation layer 1014 and the second passivation layer 1016 may include an oxide ($SiO_x$) or a nitride (e.g., $Si_xN_y$).

An amount of passivating material deposited on sidewalls of the one or more features 1008 may be dependent on aspect ratio and material. More passivating material of the first passivation layer 1014 and the second passivation layer 1016 may be deposited near an opening of the one or more features 1008 than at a bottom of the one or more feature 1008. Different amounts of passivating material in the first passivation layer 1014 and the second passivation layer 1016 may be formed on the first structure 1004 and the second structure 1006, respectively. How much of the sidewalls of the first structure 1004 and the second structure 1006 are consumed in a conventional passivation process may differ depending on a material of the first structure 1004 and a material of the second structure 1006. Furthermore, an uneven distribution of passivating material is deposited along the sidewalls of the one or more features 1008 using a conventional passivation process as shown in FIG. 10A. This results in sidewall roughness in the partially fabricated semiconductor device 1010.

FIG. 10B is a schematic illustration of a partially fabricated semiconductor device 1020 after etching through the substrate 1002 of the partially fabricated semiconductor device 1010 of FIG. 10A. The etch in FIG. 10A may etch through the substrate 1002 to form the one or more features 1008 to a first depth, and the etch in FIG. 10B may etch through the substrate 1002 to a second depth, where the second depth is greater than the first depth. In some implementations, each of the first depth and the second depth may be 50 nm or greater, or 100 nm or greater. The first passivation layer 1014 and the second passivation layer 1016 protects the sidewalls of the one or more features 1008 during the etch in FIG. 10B from lateral etching. The etch in FIG. 10B may be anisotropic and selective for removing a material of the substrate 1002 against the first passivation layer 1014 and the second passivation layer 1016. An etch rate of the material of the substrate 1002 is substantially greater than an etch rate of the first passivation layer 1014 and the second passivation layer 1016. Nonetheless, as shown in FIG. 10B, the first passivation layer 1014 and the second passivation layer 1016 are eventually removed and the sidewalls of the one or more features 1008 are exposed to lateral etching. With an uneven distribution of passivating material along the sidewalls of the one or more features 1008, varying amounts of material are laterally etched along the sidewalls. As shown in FIG. 10B, sidewall roughness is exhibited in the sidewalls of the one or more features 1008. More roughness is exhibited in an upper portion of the one or more features 1008 than in a bottom portion of the one or more features 1008 after etching. In some implementations, sidewall roughness may correspond to one or both of an LWR and LER value, where one or both of the LWR and the LER value is equal to or greater than about 2.0 nm for a given inspection length of area.

Figure 11:
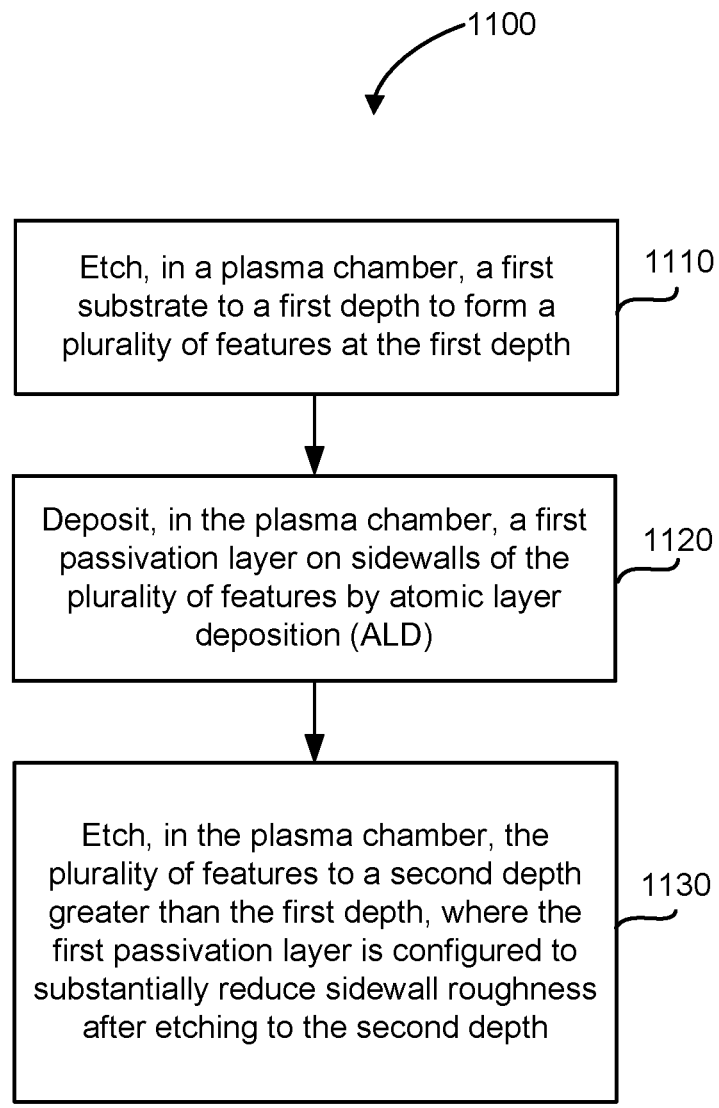
FIG. 11 is a flow diagram of an example method of reducing sidewall roughness of high aspect ratio features using integrated ALD and etch processes according to some implementations.

FIG. 11 is a flow diagram of an example method of reducing sidewall roughness of high aspect ratio features using integrated ALD and etch processes according to some implementations. The operations in a process 1100 may be performed in different orders and/or with different, fewer, or additional operations. FIG. 11 is described with reference to FIGS. 12A-12C.

At block 1110 of the process 1100, a substrate is etched in a plasma chamber to a first depth to form a plurality of features at the first depth. The substrate may be a substrate for a semiconductor device such as a transistor device (e.g., FinFET device). In some implementations, the substrate is provided in the plasma chamber. The substrate may be positioned on a substrate support in the plasma chamber. In some implementations, the substrate can be a semiconductor substrate, such as a 200-mm, 300-mm, or 450-mm substrate, including silicon substrates. The plasma chamber may be configured to perform subsequent deposition and etch processes. Aspects of the plasma chamber may be described with respect to the processing apparatus 100 in FIG. 1.

The plurality of features formed in the substrate may be high aspect ratio features. In some implementations, the high aspect ratio feature has a depth-to-width aspect ratio of at least about 5:1, at least about 10:1, at least about 15:1, at least about 20:1, at least about 30:1, at least about 40:1, at least about 50:1, or at least about 100:1. For example, the high aspect ratio feature has a depth-to-width aspect ratio equal to or greater than 10:1. In some implementations, a critical dimension of the features may be equal to or less than about 20 nm.

Etching to the first depth may etch through the substrate to partially etch to a target depth or final depth. Accordingly, etching to the target depth or the final depth may occur across multiple etching steps. In some implementations, a first depth of the plurality of features is at least about 50 nm or at least about 100 nm.

The plurality of features may be defined by a plurality of structures of the substrate after etching to the first depth. The plurality of structures may correspond to fins, interconnect lines, electrodes, contacts, vias, etc. of the semiconductor device. For example, the plurality of structures may correspond to fins of a FinFET device. In some implementations, the plurality of structures may include one or more first structures having a first material and one or more second structures having a second material. Each of the first material and the second material may include silicon, germanium, and combinations thereof. For example, the first material may include silicon and the second material may include silicon-germanium.

In some implementations, the plurality of features may have different aspect ratios. In some implementations, the plurality of features include one or more isolated features in an isolated feature region and one or more dense features in a dense feature region having a greater feature density than the isolated feature region.

Figure 12A:
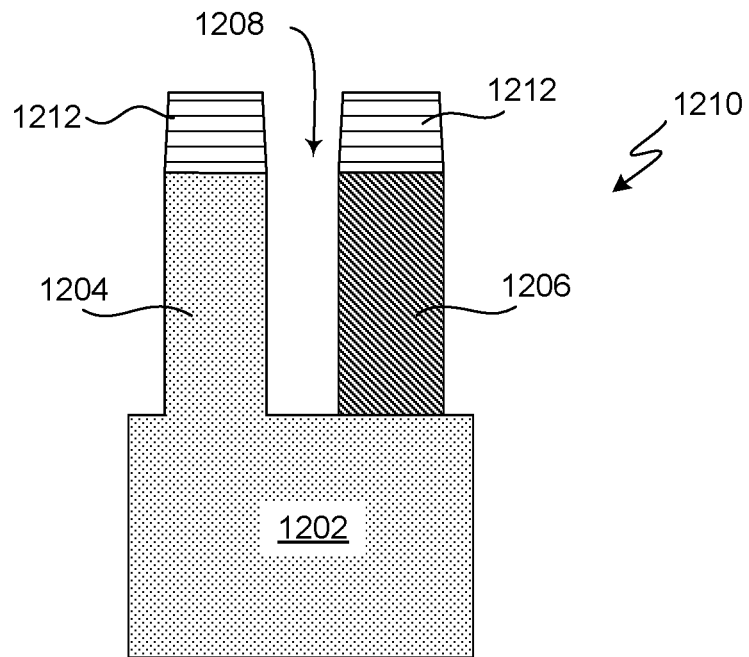
FIGS. 12A-12C are schematic illustrations of high aspect ratio features of different materials undergoing deposition and etch using integrated ALD and etch processes according to some implementations.

FIG. 12A is a schematic illustration of a partially fabricated semiconductor device 1210 including a substrate 1202, where the substrate 1202 includes a plurality of structures 1204, 1206 defining one or more features 1208. The partially fabricated semiconductor device 1210 may further include a mask 1212 on structures 1204, 1206 for defining the one or more features 1208. The one or more features 1208 are defined following an etch through the substrate 1202 or through a layer (not shown) of the substrate 1202. In some implementations, the layer of the substrate 1202 may be a gate layer of a FinFET device. The etch through the substrate 1202 may etch the one or more features 1208 to a first depth of at least about 50 nm or at least about 100 nm. In some implementations, the structures 1204, 1206 may serve as fins of a FinFET device. In some implementations, the structures 1204, 1206 may include a semiconducting material such as silicon, germanium, or combinations thereof. For example, the plurality of structures 1204, 1206 may include a first structure 1204 having a first material and a second structure 1206 having a second material, where the first material includes silicon and the second material includes silicon-germanium. In some implementations, the one or more features 1208 are STI features of the partially fabricated semiconductor device 1210.

Returning to FIG. 11, at block 1120 of the process 1100, a first passivation layer is deposited on sidewalls of the plurality of features by ALD. The first passivation layer may be deposited by ALD on exposed surfaces of the substrate, including exposed surfaces of the plurality of structures. The exposed surfaces of the plurality of structures include the sidewalls of the plurality of features. The first passivation layer may be conformally deposited to provide high step coverage even in high aspect ratio features. The step coverage in the plurality of features may be greater than 85%, greater than 90%, or greater than 95%. The deposition operation at block 1120 may be performed in the same plasma chamber as the etch operation at block 1110 without introducing a vacuum break in between operations. Performing the ALD and etch operations in the same plasma chamber reduces additional clean steps and transfers that can otherwise result in higher cost and unwanted CD/mask loss.

The first passivation layer may serve to protect the sidewalls of the plurality of features during subsequent etch processes such as an etch process described at block 1130. In some implementations, the first passivation layer includes a passivating material such as an oxide or nitride. For example, the first passivation layer includes silicon oxide ($SiO_x$).

In some implementations, the first passivation layer is relatively thin. For example, the first passivation layer has a thickness between about 0.2 nm and about 10 nm or between about 0.5 nm and about 5 nm.

As described above, ALD is a technique that deposits thin layers of material using sequential self-limiting reactions. The ALD process for conformally depositing the first passivation layer may occur in one or more cycles, where each cycle produces an adsorption-limited amount of material on the sidewalls of the plurality of features. Each cycle may include a dose step where a controlled amount of precursor material is delivered to a substrate surface to adsorb on the substrate surface in a self-limiting manner. This is also known as "soaking" the substrate surface to saturation. Each cycle may further include a conversion step following the dose step where reactant material is provided to react with the precursor material on the substrate surface and form an adsorption-limited amount of passivating material. The reactant material may include a reactant gas, where an RF power source generates plasma of the reactant gas in the plasma chamber. The reactant gas may include, for example, an oxygen-containing gas (e.g., $O_2$) or a nitrogen-containing gas (e.g., $N_2$ or $NH_3$). Radicals and other charged species of the reactant gas react with the precursor material to convert the precursor material to the adsorption-limited amount of the passivating material. In some implementations, the reactant gas is exposed to RF power delivery in a relatively short amount of time, such as between about 0.5 seconds and about 5 seconds, to form the plasma to convert the precursor material. This is also known as a "flash" operation to convert the precursor material on the substrate surface using plasma from RF power delivered in a relatively short amount of time. In some implementations, a purge step may remove excess precursor material, reaction byproducts, and/or unreacted reactant material from the plasma chamber to complete the cycle. In some implementations, the dose step and the conversion step may be repeated until a desired thickness of the first passivation layer is deposited.

Deposition of the first passivation layer is independent of aspect ratio, pitch, and material. A thickness of the first passivation layer along sidewalls of the plurality of features is relatively uniform so that approximately the same amount of material is deposited across different CDs, different aspect ratios, different pitches, different depths, and different materials. With respect to different aspect ratios, a CD bias between the one or more isolated features in the isolated feature region and the one or more dense features in the dense feature region is substantially similar after depositing the first passivation layer. As a result, a thickness of the first passivation layer along sidewalls of the plurality of features is substantially similar in the isolated feature region and the dense feature region. With respect to CD bias between isolated and dense features, "substantially similar" throughout this disclosure refers to values within plus or minus 5% of a stated value. With respect to different materials, a CD bias between the one or more first structures having the first material and the one or more second structures having the second material is substantially similar after depositing the first passivation layer. As a result, a thickness of the first passivation layer along sidewalls of the plurality of features is substantially similar for the one or more first structures and the one or more second structures. With respect to CD bias between structures of different materials, "substantially similar" throughout this disclosure refers to values within plus or minus 5% of a stated value.

Figure 12B:
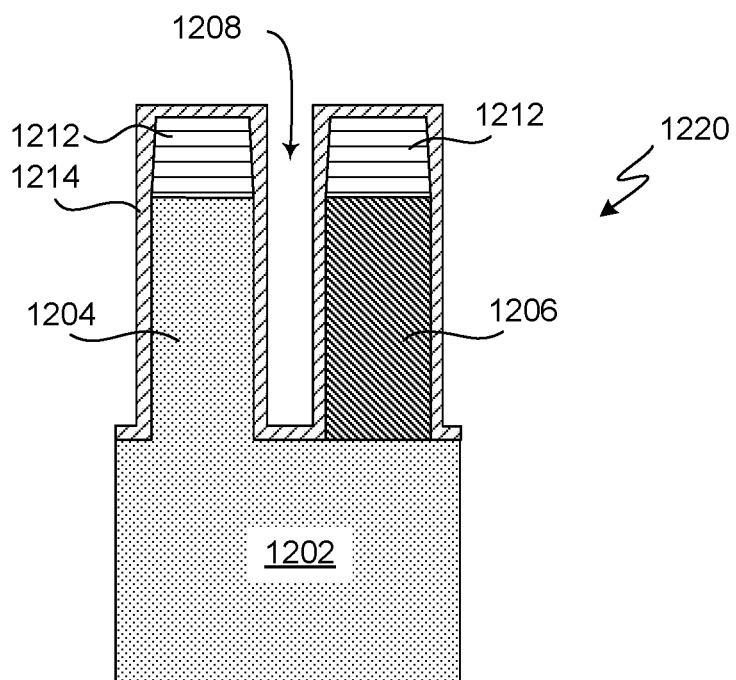

FIG. 12B is a schematic illustration of a partially fabricated semiconductor device 1220 after depositing a first passivation layer 1214 on exposed surfaces of the partially fabricated semiconductor device 1210 of FIG. 12A. The first passivation layer 1214 is deposited on sidewalls of the one or more features 1208, including on sidewalls of the first structure 1204 and the second structure 1206. The first passivation layer 1214 may also be deposited on sidewalls and a top surface of the mask 1212 and a top surface of the substrate 1202. The first passivation layer 1214 may be conformally deposited on the sidewalls of the one or more features 1208 using an ALD process as described above. In some implementations, the first passivation layer 1214 may include an oxide (e.g., $SiO_x$) or a nitride (e.g., $Si_xN_y$). In some implementations, a thickness of the first passivation layer 1214 may be between about 0.5 nm and about 5 nm.

An amount of passivating material deposited on sidewalls of the one or more features 1208 is independent of aspect ratio and material. Accordingly, a thickness of the first passivation layer 1214 is substantially similar near an opening of the one or more features 1208 than at a bottom of the one or more features 1208, and a thickness of the first passivation layer 1214 is substantially similar on the first structure 1204 and the second structure 1206. Moreover, as shown in FIG. 12B, a relatively uniform distribution of passivating material is deposited on sidewalls of the one or more features 1208 using an ALD process as described above. This results in relatively smooth sidewalls in the partially fabricated semiconductor device 1220.

Returning to FIG. 11, at block 1130 of the process 1100, the plurality of features are etched to a second depth greater than a first depth, where the first passivation layer is configured to substantially reduce sidewall roughness after etching to the second depth. The etch operation at block 1130 may be performed in the same plasma chamber as the deposition operation at block 1120 without introducing a vacuum break in between operations. Performing the ALD and etch operations in the same plasma chamber reduces additional clean steps and transfers that can otherwise result in higher cost and unwanted CD/mask loss.

The etch may be an anisotropic etch through the plurality of features to the second depth. The etch may remove material of the substrate or a layer of the substrate. The etch may be selective to remove material of the substrate against material of the first passivation layer. That way the etch performed at block 1130 etches material of the substrate at a substantially faster rate than material of the first passivation layer. In some implementations, the second depth may be equal to a target depth or final depth. In some implementations, the second depth may be less than the target depth or final depth. For example, the second depth may be any suitable percentage of the final depth, such as 30%, 40%, 50%, 60%, 70%, 80%, etc. of the final depth. The first depth may be an even smaller percentage of the final depth. Thus, multiple etches may be performed to reach the final depth. An aspect ratio of the plurality of features may be measured at the final depth, where the aspect ratio of the plurality of features may be at least 10:1.

The first passivation layer is configured to substantially prevent lateral etching of the sidewalls of the plurality of features and substantially reduce sidewall roughness in the sidewalls after etching to the second depth. Typically, conventional passivation techniques such as plasma-based "flash" passivation techniques result in sidewall roughness as shown in FIGS. 10A-10B. In some implementations, a sidewall roughness may correspond to one or both of an LWR and LER value for a given inspection area. In some implementations, conventional passivation techniques such as plasma-based "flash" passivation techniques result in LWR and/or LER values equal to or greater than about 2.0 nm. The LWR and/or LER values may be calculated for a given inspection length or area. However, since the first passivation layer is deposited uniformly along the sidewalls of the plurality of features using in-situ ALD and etch, a relatively smooth sidewall surface is achieved after etching at block 1130. In some implementations, in-situ ALD and etch techniques as described at blocks 1120 and 1130 result in LWR and/or LER values equal to or less than about 1.5 nm. As used herein, a substantially reduced sidewall roughness may correspond to LWR and/or LER values equal to or less than about 1.5 nm. The LWR and/or LER values may be calculated for a given inspection length or area, which may be the same in comparing between conventional passivation techniques and the in-situ ALD and etch techniques of the present disclosure. For example, sidewall roughness in a high aspect ratio feature may correspond to LWR values equal to or less than about 1.5 nm for an inspection length of 50 nm or greater or 100 nm or greater. Generally, sidewall roughness may be improved by at least 25% between a conventional passivation technique and the present in-situ ALD and etch technique for a given inspection length or area.

In some implementations, the etch operation performed at block 1130 is not selective to the first passivation layer so that the first passivation layer is preserved during etching. Put another way, the first passivation layer is removed at a substantially slower rate than surrounding materials. Nonetheless, a certain thickness or an entirety of the first passivation layer may be consumed by the etch at block 1130. Because the first passivation layer is conformal along the sidewalls of the plurality of features, an amount of the first passivation layer removed by the etch at block 1130 is substantially similar along the sidewalls of the plurality of features. This means that a thickness of the first passivation layer near an opening of the features is substantially similar to a thickness of the first passivation layer near a bottom of the features. The amount of the first passivation layer removed by the etch at block 1130 is independent of aspect ratio and material.

In some implementations, a dep-etch sequence following the etch at block 1130 is repeated until a desired depth or final depth is reached. The dep-etch sequence may be repeated at least two times, at least three times, or at least five times to reach the final depth. The dep-etch sequence may be repeated in the same plasma chamber without introducing a vacuum break in between operations. Thus, the process 1100 can further include depositing a second passivation layer on the sidewalls of the plurality of features by ALD in the plasma chamber and etching the plurality of features to a third depth greater than the second depth in the plasma chamber. The second passivation layer may be configured to substantially prevent lateral etching of the sidewalls of the plurality of features and to substantially reduce sidewall roughness after etching to the third depth. In some implementations, a substantially reduced sidewall roughness in a high aspect ratio feature may correspond to LWR values equal to or less than about 1.5 nm for an inspection length of 50 nm or greater or 100 nm or greater.

Figure 12C:
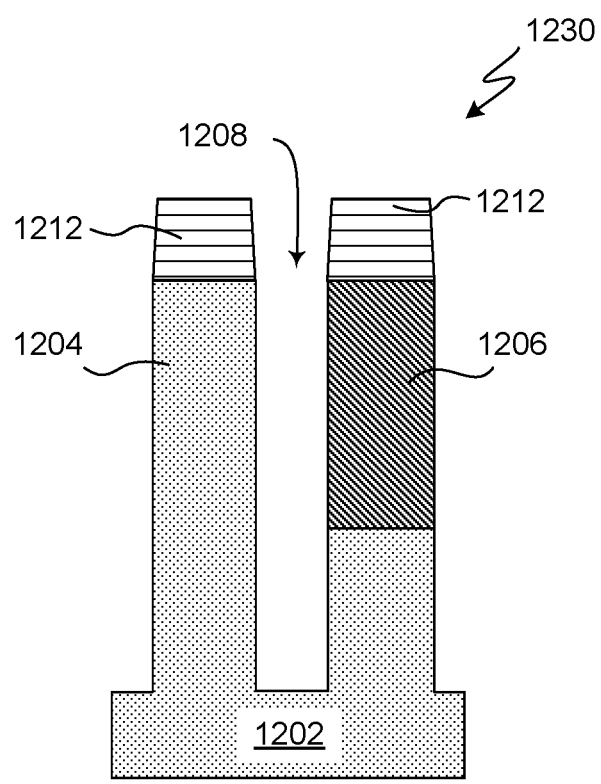

FIG. 12C is a schematic illustration of a partially fabricated semiconductor device 1230 after etching to a second depth greater than a first depth shown in the partially fabricated semiconductor device 1220 of FIG. 12B. In some implementations, each of the first depth and the second depth may be at least about 50 nm or at least about 100 nm. In some implementations, the second depth may correspond to a desired depth or final depth, or may correspond to a percentage of the desired depth or final depth. The first passivation layer 1214 protects the sidewalls of the one or more features 1208 during the etch as well as minimizes sidewall roughness from forming in the sidewalls of the one or more features 1208. The etch in FIG. 12C may be anisotropic and selective to a material of the substrate 1202 against the first passivation layer 1214. An etch rate of the substrate 1202 is substantially greater than an etch rate of the first passivation layer 1214. Nonetheless, as shown in FIG. 12C, the first passivation layer 1214 is eventually removed and sidewalls of the one or more features 1208 are exposed to lateral etching. However, with a conformal deposition of the first passivation layer 1214, sidewalls of the one or more features 1208 exhibit a smooth profile. The first passivation layer 1214 serves not only as a protective layer against lateral etching, but substantially limits roughness from forming in the sidewalls of the one or more features 1208. In some implementations, sidewall roughness may correspond to one or both of an LWR and LER value, where one or both of the LWR and the LER value are equal to or less than about 1.5 nm.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   etching, in a plasma chamber, to a first depth of a substrate to form a plurality of features at the first depth;
   depositing, in the plasma chamber, a first passivation layer on sidewalls of the plurality of features by atomic layer deposition (ALD), wherein a step coverage of the first passivation layer in the plurality of features is greater than about 95%; and
   etching, in the plasma chamber, the plurality of features to a second depth greater than the first depth, wherein the first passivation layer is configured to substantially prevent lateral etching of the sidewalls and substantially limit sidewall roughness after etching to the second depth.

2. The method of claim 1, wherein one or both of an LWR and LER value of the sidewalk is equal to or less than about 1.5 nm after etching the plurality of features to the second depth.

3. The method of claim 1, wherein the plurality of features include shallow trench isolation (STI) features.

4. The method of claim 1, wherein a depth-to-width aspect ratio of each of the plurality of features is equal to or greater than 10:1.

5. The method of claim 1, wherein a critical dimension of the plurality of features is equal to or less than about 20 nm.

6. The method of claim 1, wherein each of the first depth and the second depth is equal to or greater than about 100 nm.

7. The method of claim 1, wherein the plurality of features include one or more isolated features in an isolated feature region and one or more dense features in a dense feature region having a greater feature density than the isolated feature region, wherein a thickness of the first passivation layer along the sidewalls of the plurality of features is substantially similar in the isolated feature region and the dense feature region.

8. The method of claim 1, wherein the plurality of features are defined by a plurality of structures, wherein one or more first structures includes a first material and one or more second structures includes a second material different than the first material, wherein a thickness of the first passivation layer along the sidewalk of the plurality of features is substantially similar for the one or more first structures and the one or more second structures.

9. The method of claim 1, wherein the plurality of features are defined by a plurality of structures, each of the structures including silicon, germanium, or combinations thereof.

10. The method of claim 1, further comprising:
    depositing, in the plasma chamber, a second passivation layer on the sidewalls of the plurality of features by ALD; and
    etching, in the plasma chamber, the plurality of features to a third depth greater than the second depth in the substrate, wherein the second passivation layer is configured to substantially prevents lateral etching of the sidewalk and substantially limit sidewall roughness after etching the plurality of features to the third depth.

11. The method of claim 1, wherein the operations of depositing by ALD and etching the plurality of features in the plasma chamber are performed without introducing a vacuum break in between operations.

12. The method of claim 1, wherein the first passivation layer includes silicon oxide ($SiO_x$).

* * * * *